United States Patent
Imai

(10) Patent No.: US 6,737,207 B2
(45) Date of Patent: May 18, 2004

(54) METHOD FOR EVALUATING LITHOGRAPHY SYSTEM AND METHOD FOR ADJUSTING SUBSTRATE-PROCESSING APPARATUS

(75) Inventor: Yuji Imai, Saitama (JP)

(73) Assignee: Nikon Corporation, Tokyo (JP)

( * ) Notice: Subject to any disclaimer, the term of this patent is extended or adjusted under 35 U.S.C. 154(b) by 52 days.

(21) Appl. No.: 09/839,202

(22) Filed: Apr. 23, 2001

(65) Prior Publication Data

US 2001/0038958 A1 Nov. 8, 2001

(30) Foreign Application Priority Data

Apr. 25, 2000 (JP) ......................................... 2000-124506

(51) Int. Cl.⁷ ............................. G03F 9/00; G03C 5/00
(52) U.S. Cl. ....................................................... 430/30
(58) Field of Search ..................................... 430/30, 311

(56) References Cited

U.S. PATENT DOCUMENTS

| | | | |
|---|---|---|---|
| 5,409,538 A | 4/1995 | Nakayama et al. | 118/688 |
| 5,790,254 A | 8/1998 | Ausschnitt | 356/372 |
| 5,968,691 A | * 10/1999 | Yoshioka et al. | 430/30 |

FOREIGN PATENT DOCUMENTS

| | | |
|---|---|---|
| EP | 0 856 774 A1 | 8/1998 |
| EP | 0 973 069 A2 | 1/2000 |
| GB | 2 314 941 A | 1/1998 |
| JP | 2-10884 | 1/1990 |
| JP | A-4-361547 | 12/1992 |
| JP | B2 2530080 | 6/1996 |

* cited by examiner

Primary Examiner—Christopher G. Young
(74) Attorney, Agent, or Firm—Oliff & Berridge PLC

(57) ABSTRACT

When the ordinary exposure is performed, a wafer, to which a photoresist is applied by a resist coater, is transported onto a wafer stage of a projection exposure apparatus to perform the exposure, followed by development by a developing apparatus. When the characteristic is evaluated, respective shot areas on the wafer applied with the photoresist are exposed with an image of a predetermined evaluating mark in a narrow area in an effective field of a projection optical system of the projection exposure apparatus. The characteristic of the resist coater or the developing apparatus is evaluated by detecting a state of a resist pattern after the development. When the image formation characteristic of the projection exposure apparatus is evaluated, the wafer is exposed with images of a plurality of predetermined evaluating marks in a wide area in the effective field. The respective characteristics of the resist coater, the exposure apparatus, and the developing apparatus for constructing a lithography system can be evaluated respectively independently.

72 Claims, 10 Drawing Sheets

METHOD FOR EVALUATING LITHOGRAPHY SYSTEM AND METHOD FOR ADJUSTING SUBSTRATE-PROCESSING APPARATUS

BACKGROUND OF THE INVENTION

1. Field of the Invention

The present invention relates to a method for evaluating a lithography system for producing devices such as semiconductor elements, liquid crystal display elements, plasma display elements, and thin film magnetic heads. In particular, the present invention is preferably applied to a lithography system provided with a resist coater, an exposure apparatus, and a developing apparatus (developer).

2. Description of the Related Art

In order to respond to the improvement in degree of integration and degree of fineness of the semiconductor device, it is demanded to enhance the image formation characteristics such as the resolving power and the transfer faithfulness for the exposure apparatus to be used for the lithography step (representatively comprising the application step, the exposure step, and the resist development step) in order to produce the semiconductor device. In order to enhance the image formation characteristics as described above, for example, the following means are adopted for the exposure apparatus. That is, the wavelength of the exposure light beam as the exposure beam is shortened, the numerical aperture of the projection optical system is increased, and the new illumination system such as the modified illumination is developed.

In order to evaluate how the image formation characteristic is actually improved when the exposure condition (for example, the exposure wavelength, the numerical aperture of the projection optical system, and the illumination system) is changed, for example, the following procedure has been hitherto adopted. That is, an image of a line-and-space pattern having a line width approximate to the resolution limit is projected onto a wafer applied with photoresist by the aid of a projection optical system. For example, the line width of the resist pattern, which is obtained after development of the wafer, is measured with the scanning electron microscopy (SEM). An obtained result of the measurement is compared with the data having been measured and stored. However, in the case of this method, the following inconvenience arises. That is, the equipment for performing the evaluation is expensive, because the scanning electron microscope is required in addition to the exposure apparatus. Further, the operation to perform the evaluation is complicated, and the period of time required for the evaluation is prolonged.

In view of the above, in order to conveniently evaluate the image formation characteristic of the exposure apparatus, the following evaluation method has been suggested, as disclosed in Japanese Patent No. 2530080. That is, a plurality of resistor patterns are formed on a semiconductor substrate by using an exposure apparatus and an etching apparatus. The size of the resistor pattern is indirectly determined by measuring resistance values of the resistor patterns.

As described above, the method for performing the evaluation relatively conveniently has been hitherto suggested for the image formation characteristic of the exposure apparatus alone. However, the final shape of the circuit pattern of the semiconductor device is affected not only by the image formation characteristic of the exposure apparatus but also, for example, by the uneven application caused when the photoresist is applied onto the wafer with a resist coater and the uneven development caused when the wafer (photoresist) is developed with a developing apparatus. Therefore, it is not easy to evaluate the image formation characteristic of the exposure apparatus alone after the exposure apparatus is once incorporated into the device-producing line including, for example, the resist coater, the developing apparatus, the baking apparatus, and the cooling apparatus.

On the other hand, in order to respond to further advance of integration of the semiconductor device, it is necessary to improve the accuracy of device production as brought about by the entire lithography system by optimizing the performance of the individual apparatuses including, for example, the exposure apparatus, the resist coater, and the developing apparatus which are included in the lithography system.

The present invention has been achieved from the viewpoint as described above, a first object of which is to provide an evaluating method for effectively evaluating the performance of individual apparatuses incorporated into a lithography system. A second object of the present invention is to provide a method for evaluating and/or adjusting a lithography system in order to improve the device-producing accuracy of a lithography system. A third object of the present invention is to provide a lithography system which makes it possible to effectively evaluate the performance of individual apparatuses incorporated into the lithography system.

Further, a fourth object of the present invention is to provide an adjusting method which makes it possible to easily adjust characteristics of a substrate-processing apparatus for constructing a lithography system together with an exposure apparatus. Still another object of the present invention is to provide an exposure apparatus which makes it possible to carry out the evaluating method as described above.

SUMMARY OF THE INVENTION

A first evaluating method for a lithography system according to the present invention lies in an evaluating method for a lithography process comprising an application step of applying a photosensitive material, an exposure step, and a development step in order to form a predetermined development pattern on a substrate applied with the photosensitive material; the evaluating method comprising exposing the substrate (W1 to W4) applied with the photosensitive material with a light beam via an evaluating pattern (36A to 36D, 48, 49, 62A to 62F); developing the exposed substrate to form a development pattern; observing a state of the formed development pattern including, for example, a thickness, a line width, a length, and a position; and determining, from a result of the observation, at least one factor of an application factor inherent in the application step, an exposure factor inherent in the exposure step, and a development factor inherent in the development step which affect the development pattern respectively, independently from the other factors.

According to the present invention as described above, the concave/convex pattern of the photosensitive material is formed on the substrate by actually exposing the substrate applied with the photosensitive material with the light beam via the predetermined evaluating pattern, and developing the substrate (photosensitive material) after the exposure. In this procedure, for example, the field for the substrate during the exposure is set to a predetermined narrow area so that the factor (for example, the image formation characteristic), which affects the development pattern in the exposure step (exposure apparatus), is made to be approximately constant. In this situation, the development pattern of the photosensitive material is formed, which undergoes the change of the factor which affects the development pattern in the application step (applying apparatus) and the factor which affects the development pattern in the development step (developing apparatus). Accordingly, for example, the thickness or the distribution of the line width of the state of the pattern is measured. Thus, the application factor (for example, uneven application) or the development factor (for example, uneven development) can be evaluated respectively. Further, the development pattern of the photosensitive material, which undergoes the change of the exposure factor, is formed by setting the field during the exposure for the substrate to be, for example, an area which is wide in approximately the same degree as that when a device pattern is actually subjected to the exposure, and performing the exposure for the evaluating pattern at the periphery of the field. In this case, in order to mitigate the influence of the change of the application factor and the development factor, for example, the characteristic of the exposure step (exposure factor) can be independently evaluated by averaging measured values at a plurality of positions on the substrate. In this procedure, the state of the pattern of the photosensitive material can be measured, for example, by using an alignment sensor provided for the exposure apparatus. Therefore, the evaluation can be performed easily at low cost. In order to execute the evaluation as described above, the evaluating pattern may include inherent patterns for determining the application factor, the development factor, and the exposure factor respectively.

A second evaluating method for a lithography system according to the present invention lies in a method for evaluating a lithography system comprising an applying apparatus (54) for applying a photosensitive material to a substrate, an exposure apparatus (50) for exposing the substrate applied with the photosensitive material, and a developing apparatus (59) for developing the photosensitive material; the method comprising a first step (steps 101, 120, 128) of applying the photosensitive material onto the substrate by using the applying apparatus; a second step (steps 105, 123, 131) of exposing the substrate applied with the photosensitive material with a light beam via an evaluating pattern (36A to 36C, 48, 49, 62A to 62F) by the aid of the exposure apparatus; a third step (steps 106, 124, 132) of developing the photosensitive material on the substrate by using the developing apparatus; a fourth step (steps 107, 110, 125, 133) of measuring a development pattern of the photosensitive material on the substrate having been subjected to the development; and a fifth step (steps 108, 111, 126, 134) of evaluating one characteristic of a characteristic of the applying apparatus, a characteristic of the exposure apparatus, and a characteristic of the development apparatus which affect the development pattern respectively, independently from the other characteristics, on the basis of a result of the measurement in the fourth step.

Also in the second evaluating method for the lithography system, the predetermined characteristic of arbitrary one of the applying apparatus, the exposure apparatus, and the developing apparatus can be easily evaluated independently from the characteristics of the other apparatuses, in the same manner as in the first evaluating method for the lithography system.

In this method, on condition that the exposure apparatus comprises a projection system (PL) for projecting an image of a mask pattern onto the substrate; an image of the evaluating pattern may be projected onto a plurality of comparted areas (SA) on the substrate through a predetermined narrow area (35A) in an effective field of the projection system in the second step; and the characteristic of any one of the applying apparatus and the developing apparatus may be evaluated in the fifth step.

Alternatively, an image of the evaluating pattern may be projected onto a plurality of comparted areas (SB) on the substrate through a predetermined wide area (35) in an effective field of the projection system in the second step; and any characteristic of the projection system (for example, the image formation characteristic) of the exposure apparatus may be evaluated in the fifth step.

Further, when the exposure apparatus is a scanning exposure type exposure apparatus for exposing the substrate by synchronously moving a mask and the substrate; then the image of the evaluating pattern may be projected onto the plurality of comparted areas (SC) on the substrate in accordance with a scanning exposure manner in the second step; and a dynamic control characteristic of the exposure apparatus may be evaluated in the fifth step.

The second evaluating method for the lithography system may further comprise a sixth step of measuring the dispersion of the length in the measuring direction of the development pattern of the photosensitive material formed in the plurality of comparted areas on the substrate; and a seventh step of evaluating uneven development of the developing apparatus. The evaluating method may further comprise an eighth step of applying the photosensitive material onto another substrate by using the applying apparatus; a ninth step of exposing the photosensitive material on the substrate applied with the photosensitive material by projecting an image of a pattern different from the evaluating pattern onto the plurality of comparted areas on the substrate through a predetermined wide area in the effective field of the projection system; a tenth step of developing the photosensitive material exposed in the ninth step; and an eleventh step of evaluating any characteristic of the projection system of the exposure apparatus by measuring a development pattern of the photosensitive material developed in the tenth step. The evaluating method may further comprise adjusting the projection system in accordance with the evaluated characteristic of the projection system. When the exposure apparatus is a scanning exposure type exposure apparatus for exposing the substrate by synchronously moving a mask and the substrate; then the evaluating method may further comprise a twelfth step of applying the photosensitive material to a test substrate by using the applying apparatus; a thirteenth step of projecting an image of an evaluating mask onto the plurality of comparted areas on the substrate in accordance with a scanning exposure manner to expose the photosensitive material; a fourteenth step of developing the photosensitive material exposed in the thirteenth step; and a fifteenth step of observing and evaluating a dynamic control characteristic of the exposure apparatus.

A third evaluating method for a lithography system according to the present invention lies in an evaluating method for a lithography system comprising an exposure apparatus (50) for exposing a substrate (W) applied with a photosensitive material, and a substrate-processing apparatus (51) for processing the substrate during at least one process to be performed before or after the exposure of the photosensitive material; the evaluating method comprising transferring an evaluating pattern onto the photosensitive material by using the lithography system to form a transferred image; measuring a state of the transferred image; and independently evaluating a characteristic of the exposure apparatus and a characteristic of the substrate-processing apparatus on the basis of a result of the measurement. According to this evaluating method, the characteristic can be evaluated with ease by measuring the state (for example, latent image) of the photosensitive material after the transfer.

In the third evaluating method, a size of an area of illumination of the evaluating pattern may be adjusted depending on the characteristic to be determined when the substrate is exposed with the evaluating pattern in order to independently determine the characteristic of the exposure apparatus and the characteristic of the substrate-processing apparatus. The evaluating pattern may include patterns to determine the characteristic of the exposure apparatus and the characteristic of the substrate-processing apparatus respectively, and a development pattern of the pattern corresponding to the characteristic to be independently determined may be observed. The substrate-processing apparatus may include an applying apparatus for applying the photosensitive material onto the substrate, and a developing apparatus for developing the photosensitive material formed with the transferred image.

According to still another aspect of the present invention, there is provided an adjusting method for a substrate-processing apparatus (51) which constitutes a lithography system together with an exposure apparatus (50) for exposing a substrate (W) applied with a photosensitive material and which treats the substrate during at least one process to be performed before or after the exposure of the photosensitive material; the adjusting method comprising transferring an evaluating pattern onto the photosensitive material on the substrate by using the lithography system to form a transferred image; measuring a state of the transferred image; and detecting a characteristic of the substrate-processing apparatus independently from a characteristic of the exposure apparatus on the basis of a result of the measurement. According to this adjusting method, the state (for example, resist pattern) of the photosensitive material after the transfer is detected, and thus the characteristic of the substrate-processing apparatus can be correctly evaluated on the basis of the result of the detection. The substrate-processing apparatus may include an applying apparatus for applying the photosensitive material onto the substrate, and a developing apparatus for developing the photosensitive material formed with the transferred image. The adjusting method may further comprise adjusting the substrate-processing apparatus when the detected characteristic does not satisfy a predetermined value.

A lithography system according to the present invention lies in a lithography system for forming a predetermined development pattern on a substrate applied with a photosensitive material; the lithography system comprising an applying apparatus (54) which applies the photosensitive material to the substrate; an exposure apparatus (50) which exposes the substrate applied with the photosensitive material; a developing apparatus (59) which develops the exposed photosensitive material; a control system (22) which controls the exposure apparatus so that the substrate, to which the photosensitive material has been applied by the applying apparatus, is exposed with a light beam via a predetermined evaluating pattern by the aid of the exposure apparatus; a sensor (23, 24) which measures a state of a development pattern of the photosensitive material obtained by developing the substrate exposed by the exposure apparatus by using the developing apparatus; and a judging system (27) which judges one characteristic of a characteristic of the applying apparatus, a characteristic of the exposure apparatus, and a characteristic of the developing apparatus which affect the development pattern respectively, independently from the other characteristics, on the basis of measurement information obtained by the sensor. According to this lithography system, the characteristics of the individual apparatuses for constructing the system can be measured independently, in which the maintenance can be easily performed, and it is possible to form a device pattern with a higher degree of accuracy. The evaluating method of the present invention can be carried out by using the lithography system.

The sensor may measure at least one of uneven application of the photosensitive material, uneven development, and an image formation characteristic of the exposure apparatus. The exposure apparatus may include a projection system which projects an image of the evaluating pattern onto the substrate and a field diaphragm which restricts an illumination field for the evaluating pattern illuminated by the projection system, and the control system may control the field diaphragm depending on the characteristic to be judged. A sensor provided for the exposure apparatus may be used as the sensor described above. Accordingly, the characteristics of the applying apparatus and the developing apparatus can be evaluated within the system without introducing any new sensor into the system. It is enough that the developed pattern is returned to the exposure apparatus again along with the production line of the system, for example, by using a transport system for transporting the substrate.

According to still another aspect of the present invention, there is provided an exposure apparatus for exposing a substrate (W) applied with a photosensitive material with a light beam via a mask (R); the exposure apparatus comprising an illumination system (1 to 18) which illuminates the mask; a substrate stage which positions the substrate; a variable field diaphragm (14B) which changes a size of an illumination area illuminated by the illumination system; a first sensor (24) which measures a physical quantity corresponding to a shape of a pattern of the photosensitive material after development of the substrate on the substrate stage; a second sensor (23) which measures a position of the pattern of the photosensitive material after the development of the substrate on the substrate stage; and a judging system (27) which evaluates a state of the photosensitive material on the substrate by using results of the detection performed by the first sensor and the second sensor. The exposure apparatus of the present invention can evaluate the characteristics of the applying apparatus and the developing apparatus. Therefore, when the exposure apparatus is incorporated into the lithography system, then it is easy to perform the maintenance for the system, and the performance of the system can be maximally extracted to further improve the accuracy of the development pattern of the device. The evaluating method of the present invention can be carried out by using the exposure apparatus.

The exposure apparatus of the present invention may further comprise a projection system which projects an illumination light beam from the illumination system onto the substrate. The judging system may evaluate an image formation characteristic of the projection system by using at least one of the first sensor and the second sensor. The physical quantity may be a thickness of the photosensitive material, and the state of the photosensitive material may include uneven application of the photosensitive material and uneven development. The exposure apparatus may further comprise a control system which controls the variable field diaphragm, wherein the control system may make control such that the variable field diaphragm is narrowed when the state of the photosensitive material on the substrate is evaluated as compared with when the image formation characteristic of the projection system is observed. The second sensor provided for the exposure apparatus may be used not only to measure the position of the pattern of the photosensitive material after the development, but also to execute alignment for the substrate with respect to the illumination light beam from the projection system.

According to still another aspect of the present invention, there is provided a method for producing a device based on the use of a lithography system; comprising a first step of applying a photosensitive material onto a substrate by using the applying apparatus as defined above; a second step of exposing the substrate applied with the photosensitive material with a light beam via an evaluating pattern by using the exposure apparatus as defined above; a third step of developing the photosensitive material on the substrate by using the developing apparatus as defined above; a fourth step of measuring a development pattern of the developed photosensitive material on the substrate; a fifth step of evaluating one characteristic of a characteristic of the applying apparatus, a characteristic of the exposure apparatus, and a characteristic of the developing apparatus which affect the development pattern respectively, independently from the other characteristics, on the basis of a result of the measurement performed in the fourth step; a sixth step of adjusting the apparatus having the evaluated characteristic in accordance with the evaluated characteristic; and a seventh step of executing the first to third steps by using a pattern for forming the device in place of the evaluating pattern after the adjustment performed in the sixth step to obtain the substrate on which a development pattern for forming the device is formed. According to the method for producing the device described above, it is possible to produce the highly accurate device with a high throughput, because the characteristics of the individual apparatuses which constitute the system are independently evaluated and adjusted in a well-suited manner.

According to still another aspect of the present invention, there is provided a measuring method for measuring an application state of a photosensitive material on a substrate to be exposed by using an exposure apparatus provided with an illumination system for illuminating the substrate applied with the photosensitive material and a detector for detecting a returning light beam from the illuminated substrate; the measuring method comprising exposing the substrate applied with the photosensitive material with a light beam via an evaluating mark; and observing a state of an exposed pattern of the evaluating mark subjected to the exposure by using the illumination system and the detector to determine the application state of the photosensitive material. According to this method, the application state of the photosensitive material can be inspected with ease by using the exposure apparatus. Therefore, the exposure apparatus can be used more effectively in the lithography process or in the lithography system. In this measuring method, a latent image, which is formed by exposure with the evaluating mark, may be observed. Alternatively, a diffracted light beam from the substrate may be observed by using a substrate on which a diffraction grating-shaped evaluating mark is formed. Further alternatively, the exposed evaluating mark may be developed to observe the development pattern. As for the detector described above, a detector, which is used to execute alignment for an exposure position of the substrate when the substrate is exposed, may be used. Further, a light beam from a light source possessed by the exposure apparatus may be used when the substrate is exposed with the light beam via the evaluating mark.

According to still another aspect of the present invention, there is provided a measuring method for measuring a development state of a photosensitive material on a substrate to be exposed by using an exposure apparatus provided with an illumination system for illuminating the substrate applied with the photosensitive material and a detector for detecting a returning light beam from the illuminated substrate; the measuring method comprising exposing the substrate applied with the photosensitive material with a light beam via an evaluating mark; developing the exposed substrate; and observing a development pattern of the evaluating mark subjected to the development by using the illumination system and the detector to determine the development state of the photosensitive material. According to this method, the development state of the photosensitive material can be inspected with ease by using the exposure apparatus. Therefore, the exposure apparatus can be used more effectively in the lithography process or in the lithography system.

DESCRIPTION OF THE PREFERRED EMBODIMENTS

An exemplary embodiment of the present invention will be explained below with reference to the drawings. In this embodiment, the present invention is applied to a case in which evaluation is made for various characteristics of a lithography system for producing a semiconductor device, comprising a resist coater, a projection exposure apparatus as an exposure apparatus, and a developing apparatus (developer).

Figure 1:
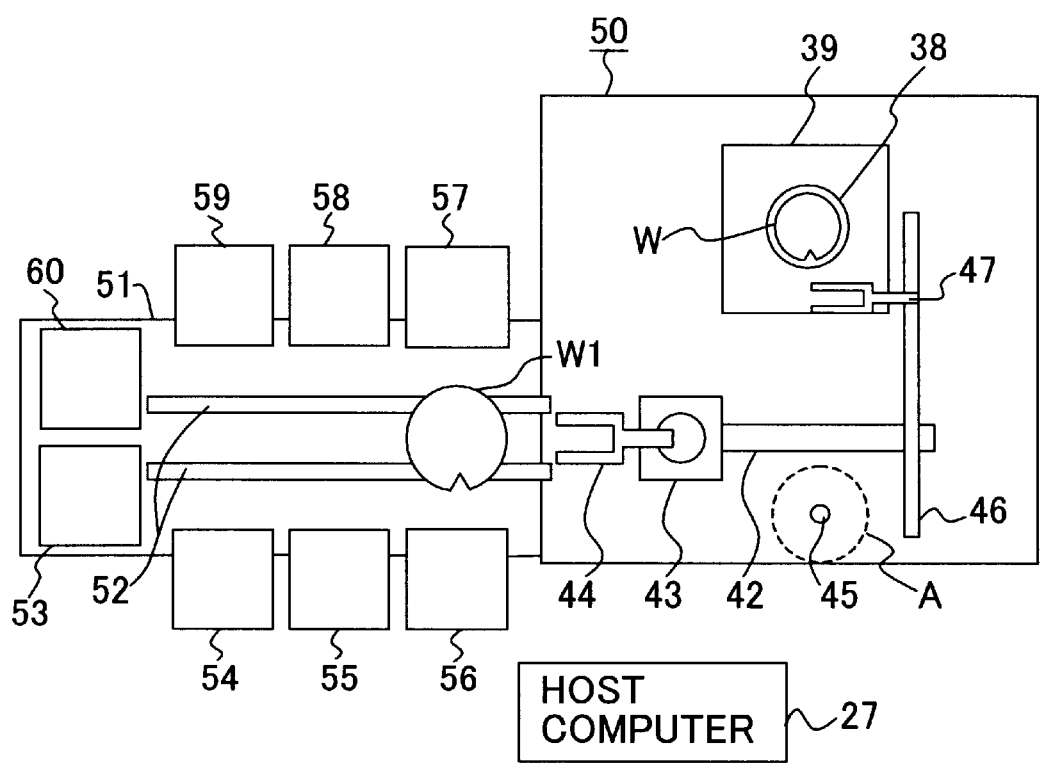
FIG. 1 shows a schematic arrangement illustrating an exemplary lithography system according to an embodiment of the present invention.

FIG. 1 shows a schematic arrangement illustrating a lithography system of this embodiment. With reference to FIG. 1, a coater-developer section 51, which serves as a substrate-processing apparatus, is installed to be in contact with a chamber for surrounding a projection exposure apparatus 50 in accordance with the in-line system. A host computer 27 is installed to collectively manage and control the entire operation of the projection exposure apparatus 50 and the coater-developer section 51. A transport line 52 for transporting a wafer as a substrate is installed to traverse a central portion of the coater-developer section 51. A first wafer cassette 53 for accommodating a large number of unexposed wafers, and a second wafer cassette 60 for accommodating a large number of exposed and developed wafers are arranged at the first end of the transport line 52. The second end of the transport line 52 is installed just before a shutter-equipped transport port (not shown) disposed at a side surface of the chamber for the projection exposure apparatus 50.

A resist coater 54 for applying a photoresist as a photosensitive material onto the wafer, a pre-bake apparatus 55 composed of a hot plate or the like for pre-baking the photoresist on the wafer, and a cooling apparatus 56 for cooling the pre-baked wafer are installed in a direction from the first wafer cassette 53 to the projection exposure apparatus 50 along the first side surface of the transport line 52 in the coater-developer section 51. Those usable as the cooling apparatus 56 include, for example, an apparatus in which a pipe for allowing cooling water to flow therethrough and a temperature sensor are installed at the inside of a base member for placing the wafer thereon, and an apparatus in which a heat-absorbing element such as a Peltier element is embedded in the base member. Further, a post-bake apparatus 57 for baking the photoresist on the wafer after the exposure, i.e., for performing so-called PEB (Post-Exposure Bake), a cooling apparatus 58 for cooling the wafer having been subjected to PEB, and a developing apparatus 59 for developing the photoresist on the wafer are installed in a direction from the projection exposure apparatus 50 to the second wafer cassette 60 along the second side surface of the transport line 52.

In the projection exposure apparatus 50 of this embodiment, the wafer W as the exposure objective is held on a wafer stage 39 by the aid of a wafer holder 38. The wafer stage 39 is moved two-dimensionally on a wafer base 40 (see FIG. 2). A first guide member 42 is arranged to extend substantially along an extension line of the central axis of the transport line 52. A slider 43 is arranged so that it is driven by an unillustrated linear motor along the first guide member 42. A first arm 44 for holding the wafer is installed rotatably and vertically movably on the slider 43. A second guide member 46 is arranged perpendicularly over the end of the first guide member 42. A second arm 47 for holding the wafer is arranged so that it is driven by an unillustrated linear motor along the second guide member 46. The second guide member 46 extends up to a wafer-loading position for the wafer stage 39. The second arm 47 is also provided with a mechanism for making sliding in a direction perpendicular to the second guide member 46.

A delivery pin 45, which is capable of making rotation and vertical movement for performing the prealignment for the wafer, is installed in the vicinity of a position of intersection between the guide members 42, 46. A position-detecting unit (not shown) for detecting the positions of two edge sections and a cutout (notch) disposed at the outer circumference of the wafer is installed around the delivery pin 45. A wafer loader system is constructed, for example, by the guide members 42, 46, the slider 43, the arms 44, 47, and the delivery pin 45.

Explanation will be made for an exemplary basic operation of the lithography system shown in FIG. 1 in the ordinary lithography step. One sheet of wafer, which is taken out from the first wafer cassette 53 on the basis of a command of the host computer 27, is transported to the resist coater 54 via the transport line 52, and the photoresist is applied to the wafer. The wafer, to which the photoresist has been applied, is successively treated by the pre-bake apparatus 55 and the cooling apparatus 56 along the transport line 52, and it is delivered to the first arm 44 of the projection exposure apparatus. After that, when the slider 43 arrives at the position in the vicinity of the delivery pin 45 along the first guide member 42, then the first arm 44 is rotated, and the wafer, to which the photoresist is applied, is delivered from the first arm 44 to the position A on the delivery pin 45. At this position, the adjustment (prealignment) is performed for the angle of rotation and the central position on the basis of the contour of the wafer. After that, the wafer is delivered to the second arm 47, and it is delivered to the loading position for the wafer along the second guide member 46. At this position, the wafer is loaded onto the wafer holder 38 on the wafer stage 39. Exposure is performed for respective shot areas on the wafer (referred to as "wafer W") with the exposure light beam passing through a predetermined device pattern on a reticle as a mask.

The wafer W, for which the exposure has been completed, is transported along the guide members 46, 42 up to the transport line 52 of the coater-developer section 51. After that, the wafer W successively passes through the post-bake apparatus 57 and the cooling apparatus 58 along the transport line 52, and it is fed to the developing apparatus 59. A resist pattern, which resides in a concave/convex structure corresponding to the device pattern on the reticle, is formed on the respective shot areas on the wafer W having been subjected to the development in the developing apparatus 59. The wafer W, for which the development has been performed as described above, is transported along the transport line 52, and it is accommodated in the second wafer cassette 60. After the completion of the lithography step, for example, one lot of wafers, which are accommodated in the second wafer cassette 60, are transported to a production line for executing, for example, the pattern-forming step such as etching and ion implantation and the resist-peeling off step.

In order to form, on the wafer W, a circuit pattern which conforms to the designed data within an allowable range, it is necessary that the resist pattern is formed on the respective shot areas on the wafer W with a high degree of resolution and a high degree of transfer faithfulness respectively by using the lithography system shown in FIG. 1. For this purpose, at first, it is necessary to apply the photoresist onto the entire surface of the wafer by using the resist coater 54 as uniformly as possible to give a target thickness. Secondly, it is necessary to perform the exposure onto the wafer through the pattern on the reticle by using the exposure apparatus 50 with a target amount of exposure at a resolution as high as possible so that the strain (distortion and magnification error) is decreased as less as possible and the overlay accuracy is increased as high as possible during the overlay exposure. Finally, it is necessary to develop the photoresist on the entire surface of the wafer under the target condition as uniformly as possible by using the developing apparatus 59. That is, it is necessary to perform the exposure in which the characteristic of the resist coater 54 (uneven application in this embodiment), the characteristic of the projection exposure apparatus 50 (image formation characteristic and overlay accuracy in this embodiment), and the characteristic of the developing apparatus 59 (uneven development in this embodiment) are included in predetermined allowable ranges respectively. For this purpose, the projection exposure apparatus 50 of this embodiment is incorporated with the mechanism for evaluating any one of the predetermined characteristics of the resist coater 54, the projection exposure apparatus 50 itself, and the developing apparatus 59, independently from the characteristics of the other apparatuses respectively.

Figure 2:
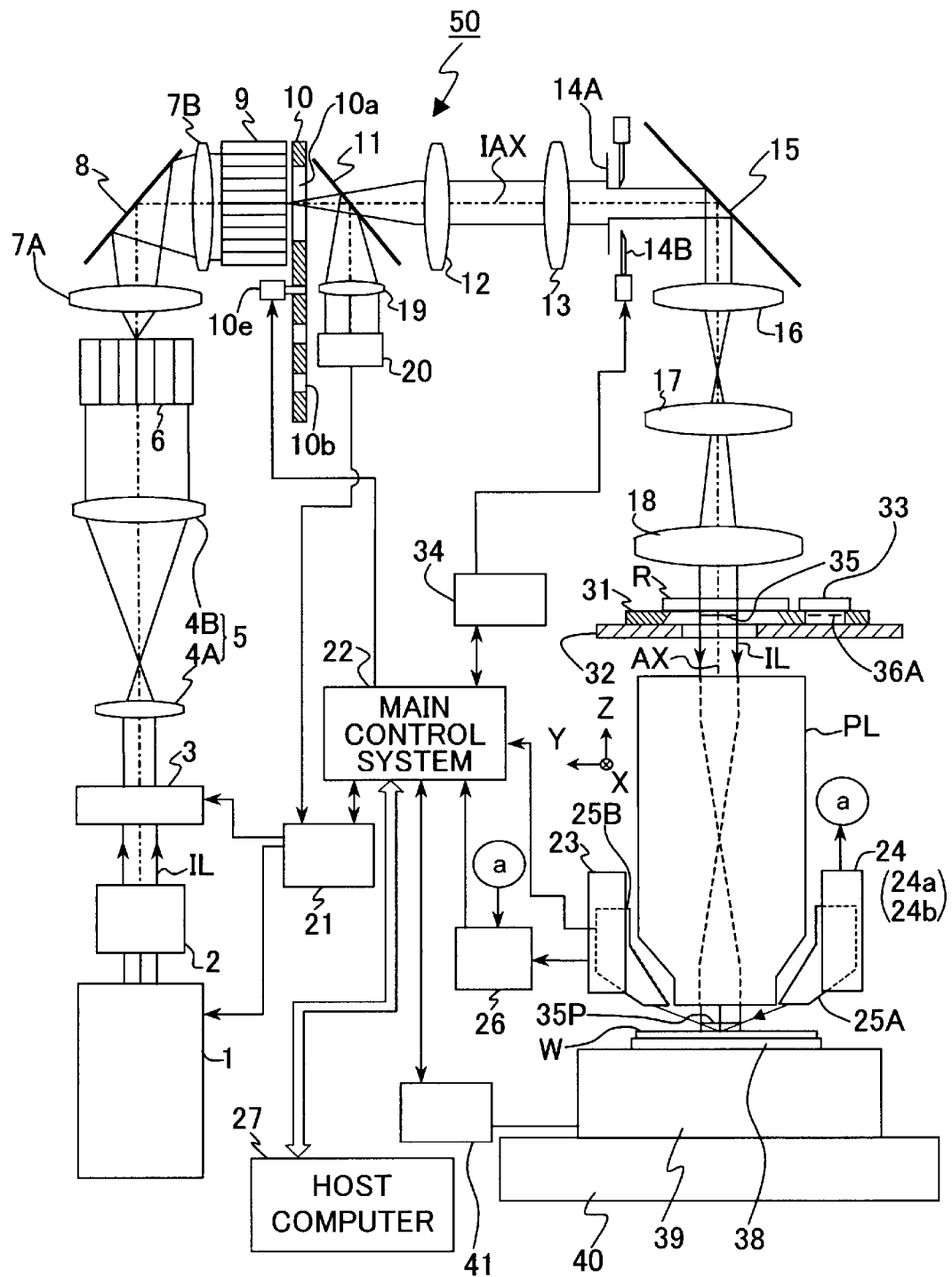
FIG. 2 shows, with partial cutaway, an arrangement depicting a projection exposure apparatus shown in FIG. 1.

FIG. 2 shows a schematic arrangement of the projection exposure apparatus 50 based on the step-and-scan manner of this embodiment. With reference to FIG. 2, an ArF excimer laser light source (wavelength: 193 nm) is used for an exposure light source 1. However, those usable as the exposure light source 1 include, for example, a KrF excimer laser (wavelength: 248 nm), an $F_2$ laser (wavelength: 157 nm), a $Kr_2$ laser (wavelength: 146 nm), a high harmonic wave generator such as a YAG laser, a high harmonic wave generator such as a semiconductor laser, and a mercury lamp. The exposure light beam IL (exposure beam) from the exposure light source 1, which is composed of an ultraviolet pulse light beam having a wavelength of 193 nm, passes through a beam-matching unit (BMU) 2, and it comes into a variable light-reducing unit 3 as a light attenuator. An exposure control unit 21, which is provided to control the amount of exposure with respect to the photoresist on the wafer, controls the start, the stop, and the output (oscillation frequency and pulse energy) of the light emission of the exposure light source 1, and it adjusts the dimming ratio at the variable light-reducing unit 3 continuously or in a stepwise manner.

The exposure light beam IL, which has passed through the variable light-reducing unit 3, passes through a beam-shaping system 5 composed of lens systems 4A, 4B, and it comes into a first fly's eye lens 6 which serves as a first stage optical integrator (uniformizer or homogenizer). The exposure light beam IL, which outgoes from the first fly's eye lens 6, passes along a first lens system 7A, an optical path-bending mirror 8, and a second lens system 7B, and it comes into a second fly's eye lens 9 which serves as a second stage optical integrator.

An aperture diaphragm plate 10 is arranged rotatably by the aid of a driving motor 10e at a light-outgoing plane of the second fly's eye lens 9, i.e., an optical Fourier transformation plane (pupil plane of the illumination system) with respect to the pattern plane (reticle plane) of the reticle R as the exposure objective. The aperture diaphragm plate 10 is switchably arranged with, for example, a circular aperture diaphragm 10a for ordinary illumination, an aperture diaphragm 10b for zonal illumination, an aperture diaphragm for modified illumination (not shown) composed of a plurality of (for example, four) eccentric small apertures, and a small circular aperture diaphragm (not shown) for a small coherence factor (σ value). The main control system 22, which collectively manages and controls the entire operation of the projection exposure apparatus 50, rotates the aperture diaphragm plate 10 by the aid of the driving motor 10e to set the illumination condition.

In FIG. 2, the exposure light beam IL, which outgoes from the second fly's eye lens 9 and which passes through the aperture diaphragm 10a for the ordinary illumination, comes into a beam splitter 11 which has a high transmittance and a low reflectance. The exposure light beam, which is reflected by the beam splitter 11, passes through a light-collecting lens 19, and it comes into an integrator sensor 20 composed of a photoelectric detector. A detection signal of the integrator sensor 20 is supplied to the exposure control unit 21. The relationship between the detection signal of the integrator sensor 20 and the illuminance of the exposure light beam IL on the wafer W as the substrate to be exposed is previously measured highly accurately, and it is stored in a memory in the exposure control unit 21. The exposure control unit 21 is constructed so that the illuminance (average value) of the exposure light beam IL on the wafer W and the integral value thereof can be indirectly monitored in accordance with the detection signal of the integrator sensor 20.

The exposure light beam IL, which has been transmitted through the beam splitter 11, passes through lens systems 12, 13 along the optical axis IAX, and it successively comes into a fixed blind (fixed illumination field diaphragm) 14A and a movable blind (movable illumination field diaphragm) 14B. The latter movable blind 14B is installed at a conjugate plane with respect to the reticle plane. The former fixed blind 14A is arranged at a plane which is defocused from the conjugate plane by a predetermined amount. For example, as disclosed in Japanese Patent Application Laid-Open No. 4-196513 and U.S. Pat. No. 5,473,410 corresponding thereto, the fixed blind 14A has an opening which is arranged to extend in a linear slit-shaped configuration or a rectangular configuration (hereinafter collectively referred to as "slit-shaped configuration") in a direction perpendicular to the scanning exposure direction at the center of the circular field of the projection optical system PL. Further, the movable blind 14B, which corresponds to the movable field diaphragm of the present invention, is used to vary the width of the illumination field area in the scanning direction in order to avoid any unnecessary exposure upon the start and the end of the scanning exposure for the respective shot areas on the wafer W. Further, the movable blind 14B is also used to vary the size of the pattern area of the reticle R or the width thereof depending on the evaluation objective as described later on in relation to the direction (non-scanning direction) perpendicular to the scanning direction. The information on the opening ratio of the movable blind 14B is also supplied to the exposure control unit 21. The value, which is obtained by multiplying the illuminance determined from the detection signal of the integrator sensor 20 by the opening ratio, represents the actual illuminance on the wafer W.

The exposure light beam IL, which has passed through the fixed blind 14A during the ordinary exposure, passes along an optical path-bending mirror 15, a lens system 16 for image formation, a subsidiary condenser lens system 17, and a main condenser lens system 18, and it illuminates an illumination area (illumination field area) 35 of the pattern plane (lower surface) of the reticle R as the mask. Under the illumination light beam IL, the image of the circuit pattern in the illumination area on the reticle R is transferred at a predetermined projection magnification β (β is, for example, ¼ or ⅕) through the projection optical system PL which is telecentric on both sides, to the slit-shaped exposure area (projection area for a pattern image conjugate with the illumination area 35) 35P of the photoresist layer on the wafer W as the substrate (substrate to be exposed) arranged on the image formation plane of the projection optical system PL. The reticle R and the wafer W can be regarded to be the first object and the second object respectively. The wafer W is, for example, a disk-shaped substrate of semiconductor (silicon or the like) or SOI (silicon on insulator). The following explanation will be made assuming that the Z axis extends in parallel to the optical axis AX of the projection optical system PL, the Y axis extends in the scanning direction (direction parallel to the plane of paper of FIG. 2 in this embodiment) in the plane perpendicular to the Z axis, and the X axis extends in the non-scanning direction (direction perpendicular to the plane of paper of FIG. 2 in this embodiment) perpendicular to the scanning direction.

With reference to FIG. 2, the reticle R is attracted and held on a reticle stage 31. The reticle stage 31 is placed on a reticle base 32 movably at a constant velocity in the Y direction and finely movably in the X direction, the Y direction, and the direction of rotation. The two-dimensional position and the angle of rotation of the reticle stage 31 (reticle R) are measured in real time by a laser interferometer installed in a driving control unit 34. A driving motor (for example, a linear motor or a voice coil motor) installed in the driving control unit 34 controls the scanning velocity and the position of the reticle stage 31 on the basis of an obtained result of the measurement and the control information supplied from the main control system 22. The driving control unit 34 sets the size of the opening of the movable blind 14B, or it opens or closes the opening in the scanning direction on the basis of the control information supplied from the main control system 22. An evaluation mark plate 33, which is composed of a glass substrate, is fixed in the vicinity of the reticle R on the reticle stage 31.

Figure 3A:
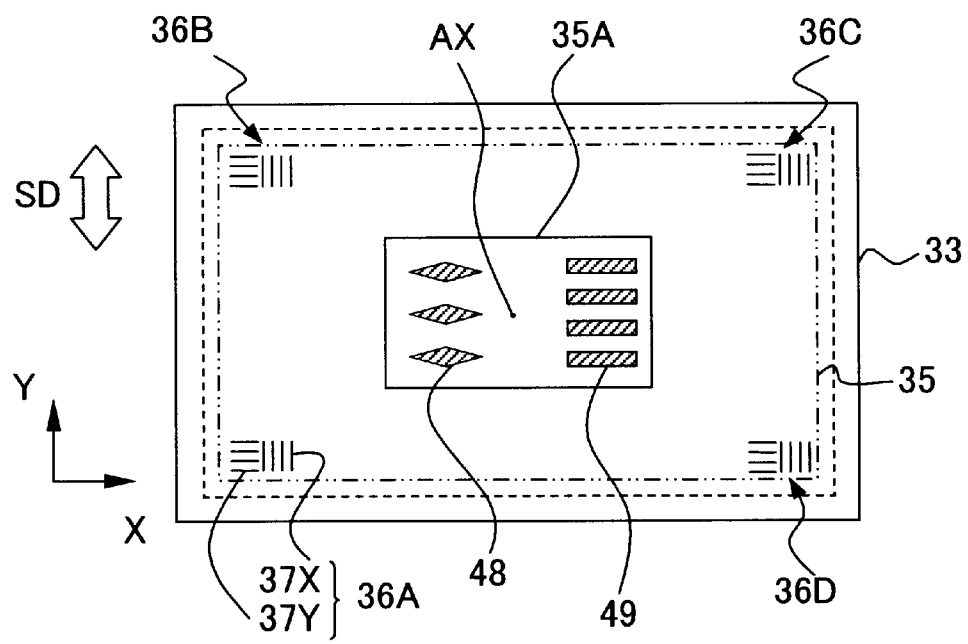
FIG. 3A shows a plan view illustrating an evaluation mark plate 33 shown in FIG. 2.

FIG. 3A shows a plan view illustrating a state in which the center of the evaluation mark plate 33 shown in FIG. 2 is allowed to approximately coincide with the optical axis AX. With reference to FIG. 3A, when the characteristic of the projection exposure apparatus 50 is evaluated, the illumination area 35 for the exposure light beam is set as indicated by two-dot chain lines so that the approximate entire evaluation mark plate 33 is covered therewith. The illumination area 35 is set to approximately inscribe the circular effective field of the projection optical system PL shown in FIG. 2, and it is a rectangular area which is slender in the non-scanning direction (x direction) perpendicular to the scanning direction SD (Y direction). For example, four identical two-dimensional evaluating marks 36A, 36B, . . . 36D are formed at positions close to the four apexes of the illumination area 35 on the evaluation mark plate 33 so that they are included at the inside of the illumination area 35. The evaluating mark 36A is a two-dimensional mark constructed by combining an X axis mark 37X which is composed of a line-and-space pattern arranged at a predetermined pitch in the X direction, and a Y axis mark 37Y which is composed of a line-and-space pattern arranged at a predetermined pitch in the Y direction. The line width of the line-and-space pattern for constructing the evaluating mark 36A is, for example, a line width which is approximately in a range of 1× (equal) to 2× (two times) with respect to the limit resolution of the projection optical system PL shown in FIG. 2. In this case, for example, each of the evaluating marks may be constructed with a plurality of line-and-space patterns having different line widths (for example, pitches or duties).

On the other hand, when the characteristic of the resist coater 54 or the developing apparatus 59 shown in FIG. 1 is evaluated, the illumination area 35A is set as indicated by dashed lines in a narrow area about the center of the optical axis AX at the central portion of the evaluation mark plate 33 shown in FIG. 3 by narrowing the opening of the movable blind 14B shown in FIG. 2. The illumination area 35A is, for example, an area in which the widths in the X direction and the Y direction are about ⅕ with respect to the illumination area 35 respectively. Two evaluating marks 48, 49 are formed adjacently on the evaluation mark plate 33 at the central portion of the illumination area 35A. The illumination area 35A is the narrow area disposed about the center of the optical axis AX in the field of the projection optical system PL. Therefore, the image of the pattern in the illumination area 35A is projected onto the image plane side by the aid of the projection optical system PL in a state in which any aberration is scarcely generated.

Figure 3B:
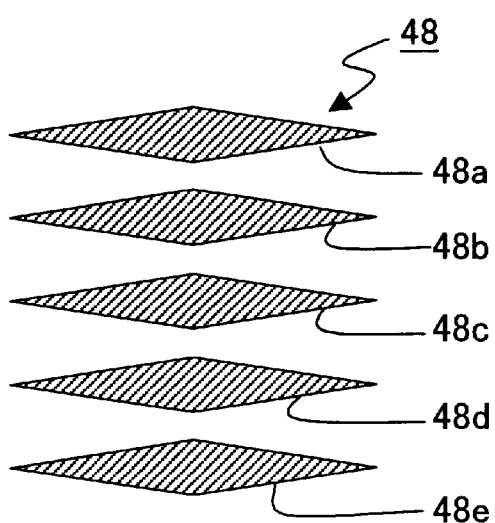
FIG. 3B shows a magnified plan view illustrating an evaluating mark 48.
Figure 3C:
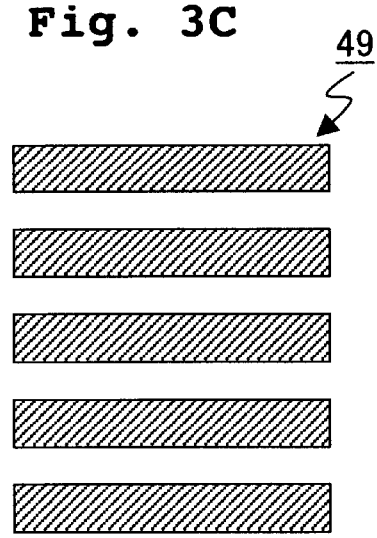
FIG. 3C shows a magnified plan view illustrating an evaluating mark 49.

In this embodiment, as shown in a magnified view in FIG. 3B, the first evaluating mark 48 is formed such that a plurality of marks 48a to 48e, each of which has a rhombus-shaped configuration slender in the measuring direction (X direction in this embodiment), i.e., each of which has wedge-shaped configurations at both ends in the measuring direction, are arranged at a predetermined pitch in the direction (Y direction) perpendicular to the measuring direction. The thickest portion of the mark 48a to 48e has a line width which is approximately in a range of 1× (equal) to 2× (two times) with respect to the limit resolution of the projection optical system PL shown in FIG. 2. The evaluating mark 48 is used to evaluate the characteristic of the developing apparatus 59 shown in FIG. 1. As shown in a magnified view in FIG. 3C, the second evaluating mark 49 resides in a line-and-space pattern arranged at a predetermined pitch in the Y direction. The line width of each of marks of the evaluating mark 49 is a loose (coarse) line width which is about several times the limit resolution of the projection optical system PL. The evaluating mark 49 is used to evaluate the characteristic of the resist coater 54 shown in FIG. 1.

Returning to FIG. 2, the wafer W is attracted and held on the wafer stage 39 by the aid of the wafer holder 38. The wafer stage 39 is movable two-dimensionally along the XY plane parallel to the image plane of the projection optical system PL on the wafer base 40. That is, the wafer stage 39 is movable at a constant velocity in the Y direction on the wafer base 40, and it is movable in a stepping manner in the X direction and the Y direction. The wafer stage 39 is further incorporated with a Z leveling mechanism for controlling the position of the wafer W in the Z direction (focus position) and the angles of rotation about the X axis and the Y axis as well. A multi-point autofocus sensors 25A, 25B, which are composed of a projecting optical system 25A for obliquely projecting a slit image onto a plurality of measuring points on the surface (detection surface) on the wafer W, and a light-receiving optical system 25B for receiving the reflected light beam from the detection surface to generate focus signals corresponding to the focus positions of the plurality of measuring points, are also provided at the side surface of the projection optical system PL. The focus signals thereof are supplied to a focusing control unit in the main control system 22.

During the scanning exposure, the focusing control unit in the main control system 22 continuously drives the Z leveling mechanism in the wafer stage 39 in accordance with the autofocus system on the basis of the information of the focus signals (focus positions). Accordingly, the surface of the wafer W is focused to the image plane of the projection optical system PL. When the characteristic is evaluated, for example, the Z leveling mechanism is driven on the basis of the focus signals. Accordingly, the focus position of the wafer W can be controlled in an arbitrary amount.

The positions of the wafer stage 39 in the X direction and the Y direction, and the angles of rotation about the X axis, the Y axis, and the Z axis are measured in real time by the laser interferometer in the driving control unit 41. The driving motor (for example, a linear motor) in the driving control unit 41 controls the scanning velocity and the position of the wafer stage 39 on the basis of the obtained result of the measurement and the control information supplied from the main control system 22.

When the scanning exposure is performed, it is necessary to previously perform the alignment for the reticle R and the wafer W. Therefore, a reticle alignment microscope (not shown) for measuring the position of the alignment mark (reticle mark) on the reticle R is installed on the reticle stage 31. Further, in order to measure the position of the alignment mark (wafer mark) on the wafer W, a first alignment sensor 23, which is based on the off-axis system and which is based on the image processing system (FIA system: Field Image Alignment system), is installed at the side surface of the projection optical system PL. The alignment sensor 23 is operated as follows. That is, for example, the detection mark is irradiated with an illumination light beam having a relatively wide wavelength region from a halogen lamp or the like. The image of the detection mark is photographed together with the index mark. An obtained image signal is processed to determine the positional discrepancy amounts of the detection mark in the X direction and the Y direction with respect to the index mark. Further, the line widths of individual marks for constructing the detection mark are determined. Obtained measured values are supplied to the main control system 22.

In order to measure the position of the wafer mark in accordance with another system as well, a second alignment sensor 24, which is based on the off-axis system, is provided on the side surface of the projection optical system PL. The alignment sensors 23, 24 correspond to the second sensor and the first sensor of the present invention respectively. The alignment sensor 24 comprises a sensor 24a (hereinafter referred to as "LIA sensor 24a") based on the LIA (Laser Interferometric Alignment) system for radiating two light fluxes (or one light flux in some cases) having slightly different frequencies onto the diffraction grating-shaped detection mark and detecting the interference light composed of a plurality of interference light beams generated from the detection mark, and a sensor 24b (hereinafter referred to as "LSA sensor 24b") for relatively scanning the dot array-shaped detection mark and the laser beam radiated in a slit-shaped configuration and detecting the diffracted light generated from the detection mark. As for the LIA sensor 24a, for example, the more detailed arrangement is disclosed in Japanese Patent Application Laid-Open No. 2-227602 (Japanese Patent No. 2814520 and U.S. Pat. No. 5,489,986 corresponding thereto). As for the LSA sensor 24b, for example, the more detailed arrangement is disclosed in Japanese Patent Application Laid-Open No. 60-130742 (Japanese Patent Publication No. 6-16478 and U.S. Pat. No. 4,677,301 corresponding thereto). In this embodiment, in place of the LIA sensor 24a, a sensor may be adopted, which is based on a system in which one coherent beam is radiated substantially perpendicularly onto a detection mark to cause interference and receive at least a pair of diffracted light beams (for example, ±n-order diffracted light beams having an equal order) generated from the detection mark.

A photoelectrically converted signal (detection signal) of the interference light of the LIA sensor 24a and a photoelectrically converted signal (detection signal) of the diffracted light of the LSA sensor 24b are supplied to an alignment signal-processing unit in the main control system 22 respectively. The alignment signal-processing unit detects the coordinate of the detection mark during the alignment by using the detection signal of the LIA sensor 24a or the LSA sensor 24b and the measured value of the coordinate of the wafer stage 39. When the characteristic of the lithography system is evaluated, the alignment signal-processing unit calculates the thickness of the resist pattern on the detection mark from the magnitude of the detection signal of the LIA sensor 24a, and it calculates the length of the detection mark in the measuring direction by using the detection signal of the LSA sensor 24b and the coordinate of the wafer stage 39.

The scanning exposure is performed after performing the alignment for the wafer W by using the alignment sensor 23 or 24. That is, the main control system 22 sends various pieces of information including, for example, the movement positions, the movement velocities, the rates of acceleration of movement, and the position offsets of the reticle stage 31 and the wafer stage 39 respectively, to the driving control units 34, 41. In response thereto, the reticle R is scanned at the velocity Vr in the +Y direction (or in the −Y direction) with respect to the illumination area 35 of the exposure light beam IL by the aid of the reticle stage 31, in synchronization with which the wafer W is scanned at the velocity β·Vr (β represents the projection magnification from the reticle R to the wafer W) in the −Y direction (or in the +Y direction) with respect to the exposure area 35P for the pattern image on the reticle R by the aid of the wafer stage 39. In order to avoid any exposure onto unnecessary portions at the start and the end of the scanning exposure during this process, the opening/closing operation of the movable blind 14B is controlled by the driving control unit 34. The reason why the movement direction of the reticle R is opposite to that of the wafer W is that the projection optical system PL of this embodiment performs the inverting projection.

Further, the main control system 22 reads, from the exposure data file, various exposure conditions for performing the scanning exposure in a proper exposure amount for the photoresist in each of the shot areas on the wafer W, and it executes the optimum exposure sequence in cooperation with the exposure control unit 21 as well. That is, when the command to start the scanning exposure for one shot area on the wafer W is issued from the main control system 22 to the exposure control unit 21, then the exposure control unit 21 starts the light emission of the exposure light source 1, and it calculates the integral value of the illuminance of the exposure light beam IL for the wafer W (sum of the pulse energy per unit time) by the aid of the integrator sensor 20. The integral value is reset to zero upon the start of the scanning exposure. The exposure control unit 21 successively calculates the integral value of the illuminance, and it controls the output of the exposure light source 1 (oscillation frequency and pulse energy) and the dimming ratio of the variable light-reducing unit 3 depending on an obtained result so that the proper exposure amount is obtained at respective points on the photoresist on the wafer W after the scanning exposure. The light emission of the exposure light source 1 is stopped after completion of the scanning exposure for the concerning shot area.

Next, explanation will be made with reference to a flow chart shown in FIGS. 8A and 8B and FIGS. 9A and 9B for an example of the operation (evaluation sequence) for evaluating the predetermined characteristics of the resist coater 54, the projection exposure apparatus 50, and the developing apparatus 59 of the lithography system shown in FIG. 1 of this embodiment. The evaluation of the characteristics may be executed periodically. Alternatively, for example, the evaluation may be executed when the type of the photoresist is changed, or when the development process is changed.

At first, in the step 101 shown in FIG. 8, the photoresist is applied to an unexposed wafer W1 by using the resist coater 54 shown in FIG. 1 under the control of the host computer 27. After that, the wafer W1 is treated with the pre-bake apparatus 55 and the cooling apparatus 56, and it is loaded onto the wafer stage 39 (wafer holder 38) of the projection exposure apparatus 50 (step 102). Subsequently, the reticle stage 31 shown in FIG. 2 is driven to allow the center of the evaluation mark plate 33 to coincide with the center of the effective field (optical axis AX) of the projection optical system PL (step 103). The movable blind 14B is controlled to set the illumination area of the exposure light beam IL to the central narrow illumination area 35A of the effective field as shown in FIG. 3A (step 104). In this state, only the evaluating marks 48, 49 can be illuminated. Images of the evaluating marks 48, 49 can be projected in a state in which there is little influence of the aberration of the projection optical system PL.

In the step 105, the projection exposure apparatus 50 shown in FIG. 2 is regarded to be a projection exposure apparatus of the full field exposure type, and the respective shot areas SA on the wafer W1 are exposed with the images of the evaluating marks 48, 49 in the illumination area 35A by the aid of the projection optical system PL in accordance with the step-and-repeat manner.

Figure 4A:
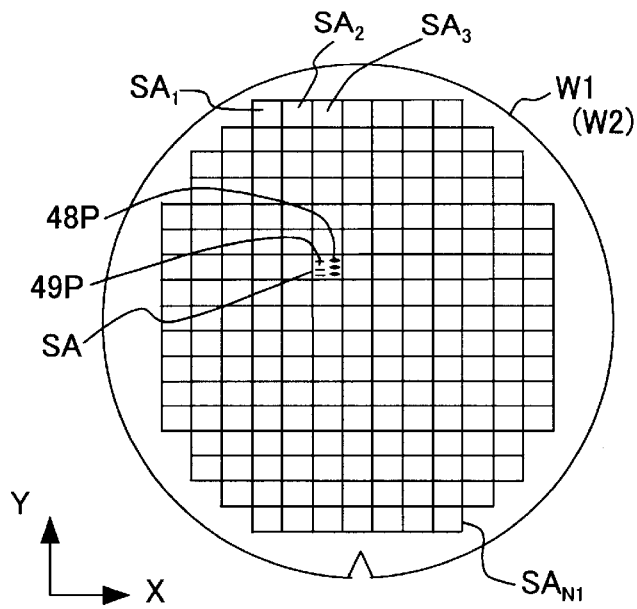
FIG. 4A shows a plan view illustrating a shot array on a wafer for evaluating a resist coater and a developing apparatus.
Figure 4B:
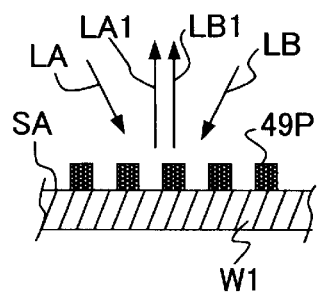
FIG. 4B shows a magnified sectional view to explain a method for measuring a resist pattern 49P.
Figure 5A:
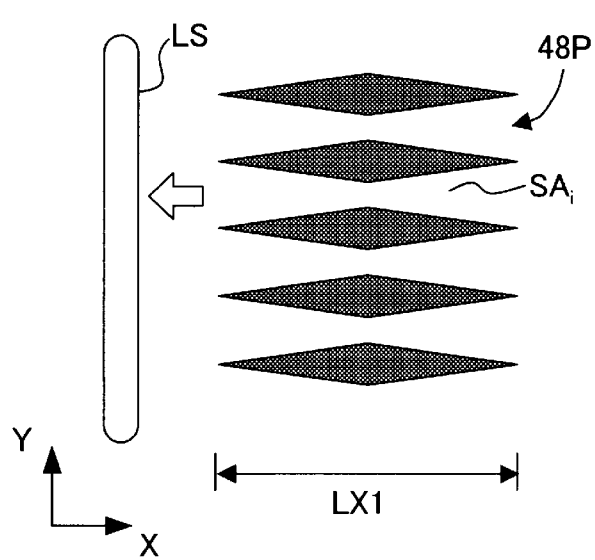
FIGS. 5A and 5B illustrate a method for measuring a resist pattern with wedge-shaped both ends.

FIG. 4A shows the wafer W1 exposed as described above. With reference to FIG. 4A, the exposure surface of the wafer W1 is divided into N1 individuals of shot areas $SA_1$, $SA_2$, ... $SA_{N1}$ (they are representatively referred to as "shot areas SA") each having approximately the same size as that of the conjugate image of the illumination area 35A which is narrow in the X direction and the Y direction. The respective shot areas SA are exposed with the images 48P, 49P of the evaluating marks 48, 49 respectively. In the next step 106, the wafer W1 after the exposure is transported to the developing apparatus 59 via the post-bake apparatus 57 and the cooling apparatus 58 shown in FIG. 1. In the developing apparatus 59, the photoresist on the wafer W1 is developed. The wafer W1 after the development is transported via the transport line 52, and it is loaded onto the wafer stage 39 of the projection exposure apparatus 50 again. In this case, resist patterns (also referred to as 48P, 49P), which have a concave/convex structure corresponding to the images 48P, 49P of the evaluating marks 48, 49 respectively, are formed on the respective shot areas SA on the wafer W1 shown in FIG. 4A. As shown in FIG. 4B, the latter resist pattern 49P is a diffraction grating-shaped mark having a predetermined pitch in the X direction. As shown in FIG. 5A, the former resist pattern 48P is a plurality of concave/convex patterns with both sides having wedge-shaped configurations.

In the subsequent step 107, detection signals, which correspond to the intensities of the interference light beams (diffracted light beams) from the resist patterns 49P of all of the shot areas SA on the wafer W1 shown in FIG. 4A, are detected by using the LIA sensor 24a of the alignment sensor 24 under the control of the main control system 22 shown in FIG. 2. Results of the detection are supplied to the host computer 27. As shown in FIG. 4B, two light fluxes LA, LB are radiated from the LIA sensor 24a onto the resist pattern 49P. The +1-order diffracted light LA1 of the light flux LA and the −1-order diffracted light LB1 of the light flux LB are generated in parallel as interference light from the resist pattern 49P, and the interference light is detected. In this case, the average value of the intensities of the interference light varies depending on the film thickness of the remaining resist, i.e., the difference in height of the resist pattern 49P on each of the shot areas SA. Therefore, for example, the relationship between the difference in height of the resist pattern 49P and the average value of the detection signals of the interference light is previously determined experimentally to obtain a table which is stored in the data file of the host computer 27 beforehand. The host computer 27 determines the distribution of the film thickness of the resist remaining on the wafer W1 from the table and the average value of the detection signals of the interference light in the respective shot areas SA. The host computer 27 estimates, as the uneven application, the dispersion of the film thickness (for example, standard deviation) and the average film thickness obtained when the photoresist is applied to the wafer W1 with the resist coater 54, from the film thickness distribution.

In the next step 108, the host computer 27 checks whether or not the resist coater 54 is abnormal, i.e., whether or not the average film thickness of the photoresist and the dispersion of the film thickness estimated in the step 107 are included within allowable ranges with respect to the target values (0 for the dispersion) prescribed for the photoresist of the concerning type. If there is any abnormality, the host computer 27 issues alarm information on the resist coater 54 to the operator. In response thereto, the maintenance is performed for the resist coater 54 in the step 109. After that, the evaluation sequence of the steps 101 to 108 may be executed again for another unexposed wafer W2.

Figure 4C:
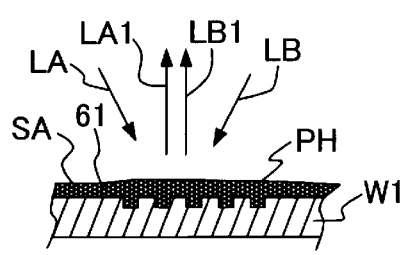
FIG. 4C shows a magnified sectional view illustrating another example of a method for measuring the film thickness of photoresist.

In the embodiment described above, the resist pattern 49P which has been developed is detected in order to evaluate the resist coater 54. However, as shown in FIG. 4C, the following procedure may be available. That is, a concave/convex diffraction grating-shaped mark 61 is formed on each of the shot areas SA on the wafer W1 beforehand. After the photoresist PH is applied onto the wafer W1, the light fluxes LA, LB are radiated onto the mark 61 from the LIA sensor 24a to detect the interference light (LA1, LB1) from the mark 61. Also in this case, the average value of intensities of the interference light from the mark 61 varies depending on the film thickness of the photoresist PH on the shot area SA. Therefore, the film thickness distribution of the photoresist PH on the wafer W1 can be determined from detection signals of the LIA sensor 24a without performing the exposure and the development. In this example, the resist coater 54 can be evaluated for a short period of time, because the exposure step and the development step can be omitted. A light beam having a wavelength, which is not absorbed by the photoresist PH, i.e., with which the photoresist PH is not exposed, is used as the light fluxes LA, LB from the LIA sensor 24a.

In place of the detection of the resist pattern 49P which has been developed, a latent image of the evaluating mark 49 formed on the resist may be detected, for example, by using the LIA sensor 24a. The average film thickness of the photoresist and the film thickness distribution may be determined on the basis of the obtained detection result. In this case, the resist coater 54 can be evaluated for a short period of time, because the development step for the photoresist can be omitted. A light beam having a wavelength, which is not absorbed by the photoresist PH, i.e., with which the photoresist PH is not exposed, is used as the light fluxes LA, LB from the LIA sensor 24a.

Similarly, the projection exposure apparatus 50 shown in FIG. 2 may be provided with a film thickness-measuring unit based on the interferometer system or the ellipsometer system. The thickness distribution of the photoresist on the wafer may be directly measured with the film thickness-measuring unit before the exposure. Further, for example, the film thickness of the photoresist, the dispersion thereof and other factors may be detected by using an interatomic force microscope. When the uneven application as described above is estimated by transferring the evaluating mark 48, 49 onto the photoresist, a state is regarded to be established in this embodiment, in which there is little influence of the aberration of the projection optical system PL, by arranging the evaluating mark 48, 49 at the center (on the optical axis AX) of the projection field of the projection optical system PL. However, when it is impossible to neglect the influence of the aberration of the projection optical system PL, the following procedure is preferably adopted. That is, the information on aberration (for example, wave front aberration) of the projection optical system PL is previously determined by means of a method which does not undergo the influence of the uneven application or the like, for example, by means of the spatial image measurement in which a projected image of an evaluating mark is detected on the image plane side of the projection optical system PL. The uneven application or the like is determined based on the use of the information on aberration as well.

The maintenance operation for the resist coater 54 in the step 109 also includes, for example, the resetting operation (change) for the application condition for the photoresist (including, for example, the rotation speed and the number of revolution of the wafer in the case of the spin coat method, or including, for example, the movement speeds of the wafer and the nozzle in the case of the scan coat system). Further, an operator may adjust the resist coater 54, for example, on the basis of the film thickness and the dispersion thereof determined in the step 107. Alternatively, the host computer 27 may give a command to the resist coater 54 to perform, for example, the change of the application condition.

If the resist coater 54 is not abnormal, the operation proceeds from the step 108 to the step 110. In this procedure, the detection signals, which correspond to the diffracted light from the resist patterns 48P of all of the shot areas SA on the wafer W1 shown in FIG. 4A, are incorporated by the main control system 22 shown in FIG. 2 while corresponding to the X coordinates of the wafer stage 39 by using the LSA sensor 24B of the alignment sensor 24. The laser beam LS is radiated in a slit-shaped configuration from the LSA sensor 24b so that the laser beam LS extends in the Y direction as depicted with the shot area $SA_i$ shown in FIG. 5A. When the wafer stage 39 is driven in the X direction to relatively scan the resist pattern 48P and the laser beam LS, the diffracted light is generated from the resist pattern 48P provided that even a part of the resist pattern 48P is irradiated with the laser beam LS. Accordingly, the main control system 22 determines a range of the X coordinate of the wafer stage 39 at which the level of the detection signal of the diffracted light is not less than a predetermined value. This range is regarded to be the length LX1 of the resist pattern 48P in the shot area $SA_i$. Similarly, the main control system 22 determines the lengths of the resist pattern 48P in all of the shot areas SA. Measured values are supplied to the host computer 27.

Figure 5B:
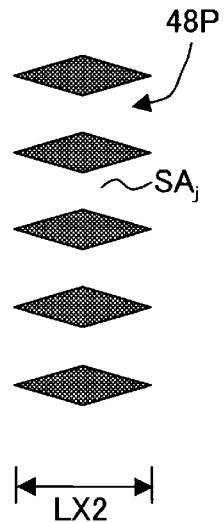

In this case, if it is assumed that the state of the development is unsatisfactory, for example, in the shot area $SA_j$ shown in FIG. 5B, the length LX2 of the resist pattern 48P is smaller than LX1. Therefore, the length of the resist pattern 48 corresponds to the state of the development. On the basis of this principle, the host computer 27 assumes that the average value of the lengths of the resist patterns 48P in all of the shot areas SA on the wafer W1 and the dispersion (for example, standard deviation) represent the uneven development caused upon the development for the photoresist in the developing apparatus 59.

In the next step 111, the host computer 27 checks whether or not the developing apparatus 59 is abnormal, i.e., whether or not the uneven development (average value of the length of the resist pattern 48P and the dispersion) determined in the step 110 is included in an allowable range with respect to the target value (0 for the dispersion) prescribed for the photoresist of the concerning type. If there is any abnormality, the host computer 27 issues alarm information on the developing apparatus 59 to the operator. In response thereto, the maintenance is performed for the developing apparatus 59 in the step 112. In the step 112, for example, the change of the development condition (for example, the development time) for the developing apparatus 59 based on the uneven development is performed, for example, by the operator or the host computer 27. After that, the evaluation sequence corresponding to the steps 101 to 106, 110, 111 may be executed again.

Figure 9A:
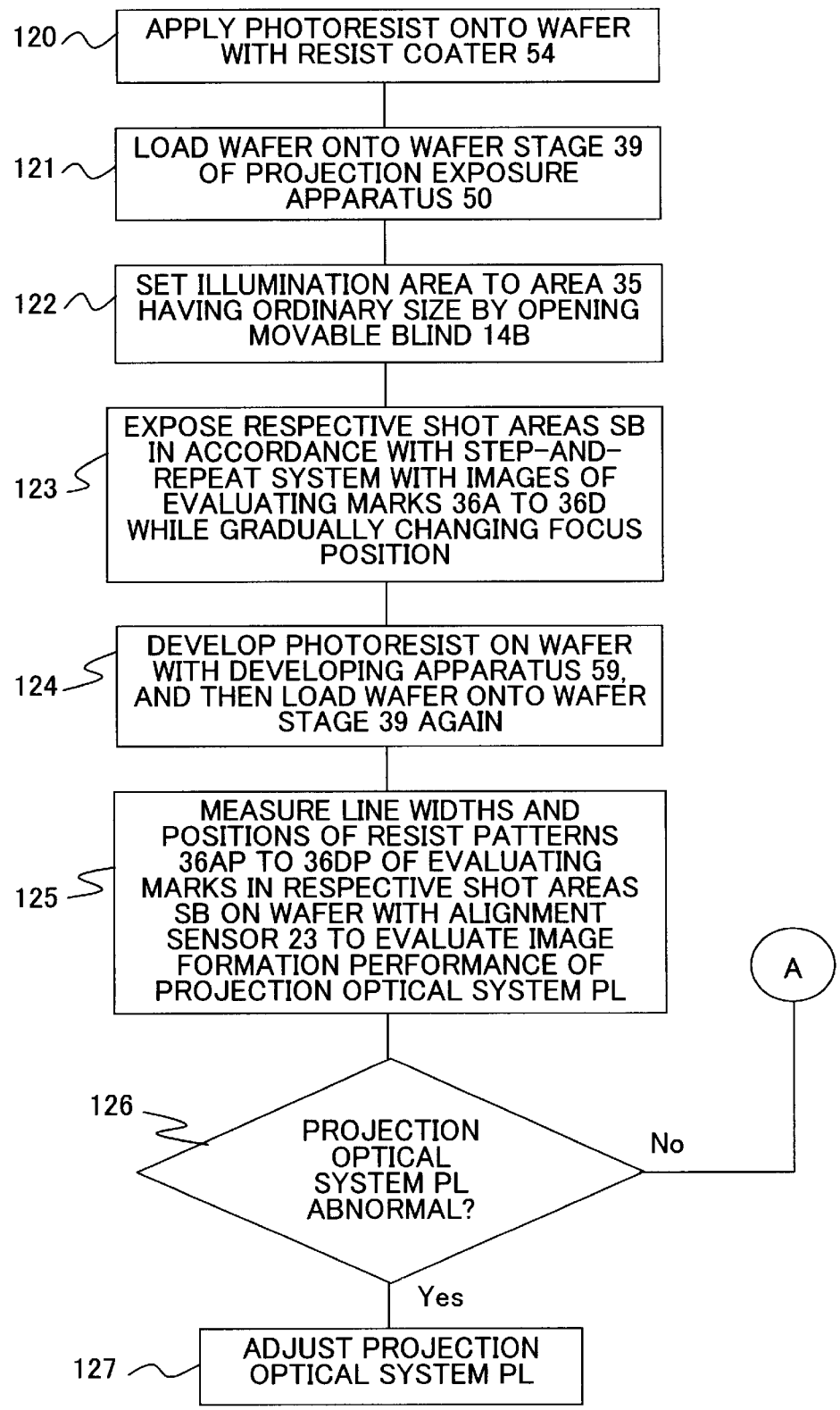
FIGS. 9A and 9B show a flow chart illustrating the latter half of the evaluation sequence for the lithography system.
Figure 9B:
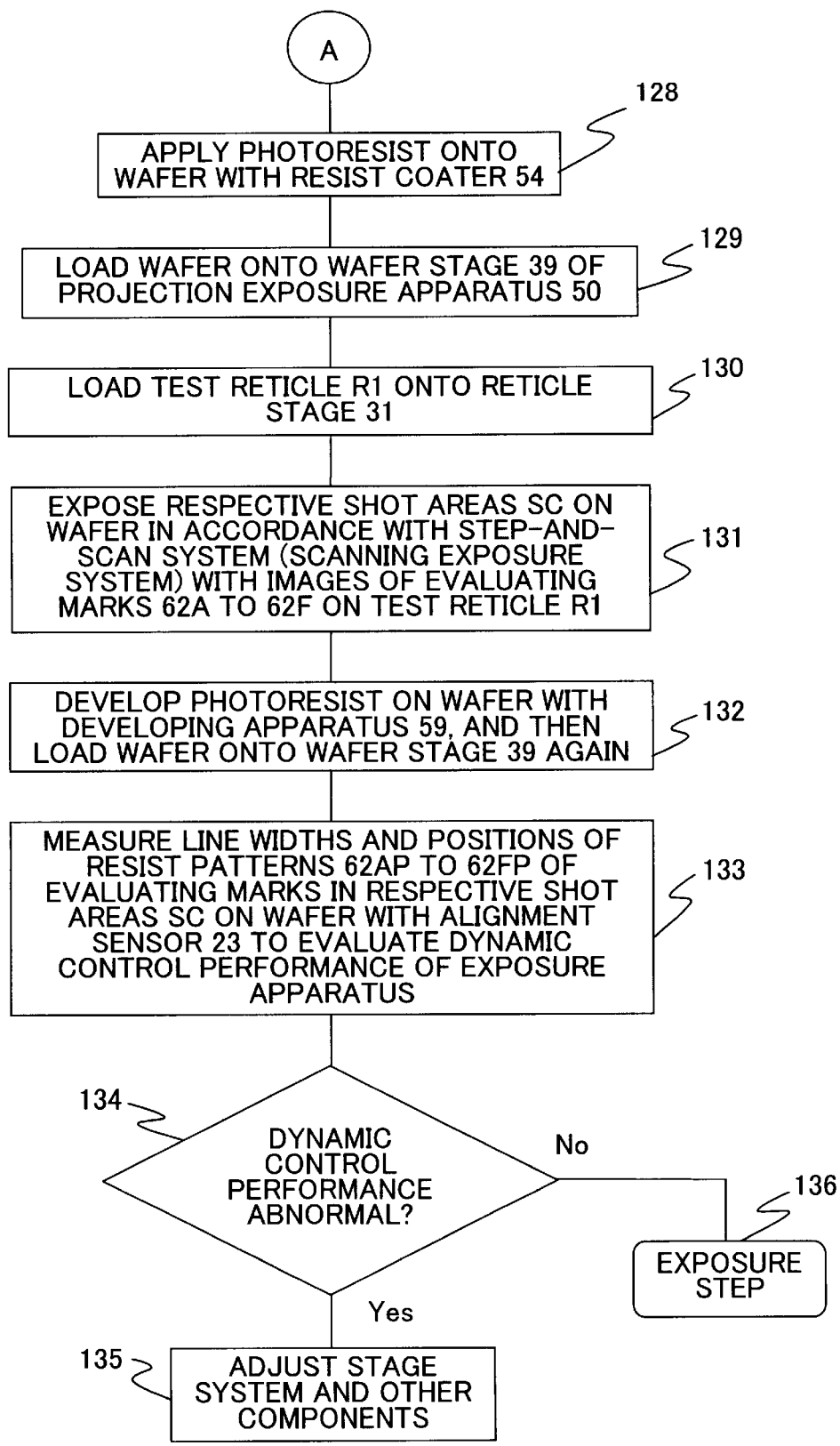

If the developing apparatus 59 is not abnormal as well, the operation proceeds from the step 111 to the step 120 shown in FIG. 9A to evaluate the image formation characteristics of the projection exposure apparatus 50. For this purpose, the photoresist is applied to an unexposed wafer (referred to as "W3") by using the resist coater 54 shown in FIG. 1 under the control of the host computer 27. After that, the wafer W3 is treated with the pre-bake apparatus 55 and the cooling apparatus 56, and it is loaded onto the wafer stage 39 of the projection exposure apparatus 50 (step 121). Subsequently, the opening of the movable blind 14B is opened in a state in which the center of the evaluation mark plate 33 shown in FIG. 2 is allowed to coincide with the optical axis AX so that the illumination area of the exposure light beam IL is set to be the illumination area 35 having the ordinary size as shown in FIG. 3A (step 122). In this state, the evaluating marks 36A to 36D, which are disposed at the periphery of the effective field of the projection optical system PL, can be illuminated.

In the step 123, the projection exposure apparatus 50 shown in FIG. 2 is regarded as a projection exposure apparatus of the full field exposure type, and the respective shot areas SB on the wafer W3 are exposed with the images of the evaluating marks 36A to 36D in the illumination area 35 by the aid of the projection optical system PL in accordance with the step-and-repeat manner.

Figure 6A:
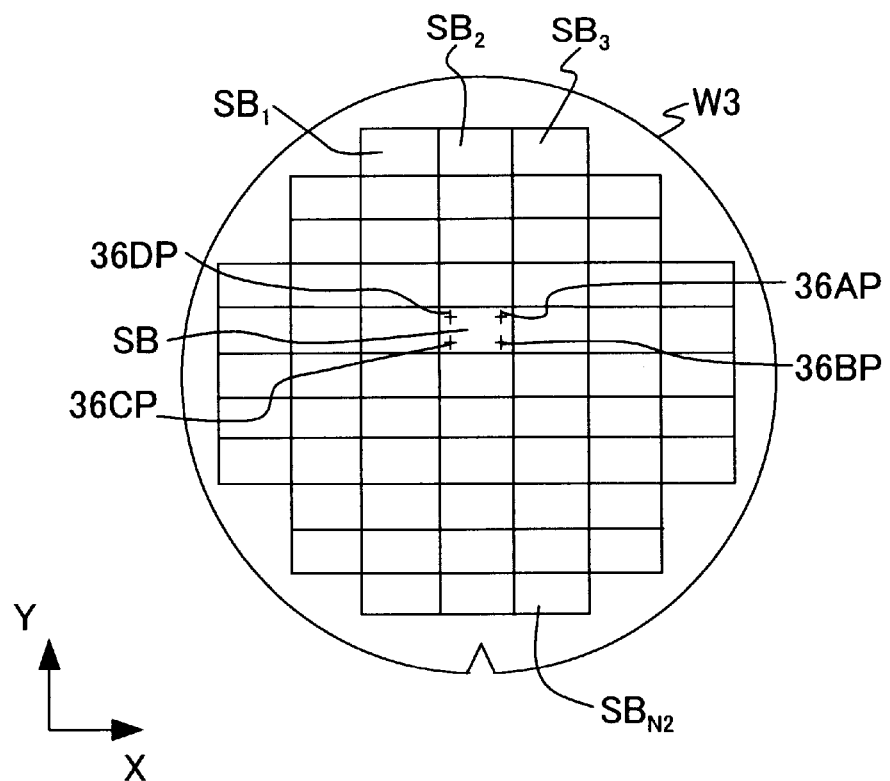
FIG. 6A shows a plan view illustrating a shot array on a wafer for evaluating a projection optical system of a projection exposure apparatus.
Figure 6B:
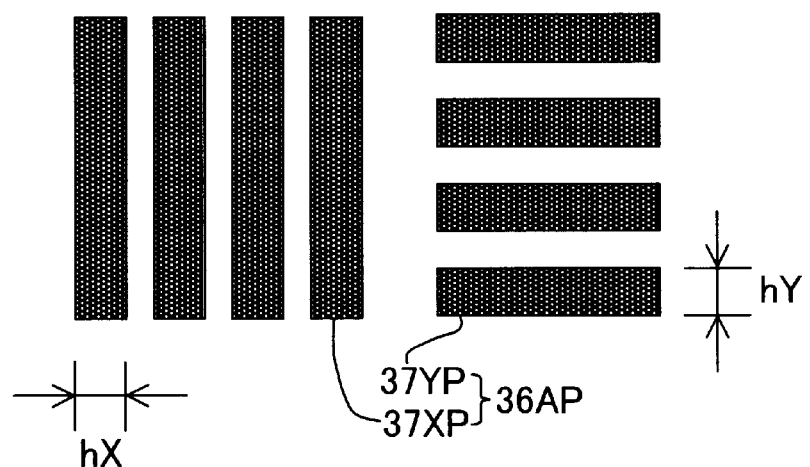
FIG. 6B shows a magnified plan view illustrating a resist pattern formed on respective shot areas on the wafer.

FIG. 6A shows the wafer W3 exposed as described above. With reference to FIG. 6A, the exposure surface of the wafer W3 is divided into N2 (N2<N1) individuals of shot areas $SB_1$, $SB_2$, ... $SB_{N2}$ (they are representatively referred to as "shot areas SB") each having approximately the same size as that of the conjugate image of the illumination area 35 which is slender in the X direction and the Y direction. The respective shot areas SB are exposed with the images 36AP to 36DP of the evaluating marks 36A to 36D respectively. In the next step 124, the wafer W3 after the exposure is transported to the developing apparatus 59 via the post-bake apparatus 57 and the cooling apparatus 58 shown in FIG. 1. In the developing apparatus 59, the photoresist on the wafer W3 is developed. The wafer W3 after the development is transported via the transport line 52, and it is loaded onto the wafer stage 39 of the projection exposure apparatus 50 again. In this case, resist patterns (also referred to as 36AP to 36DP), which have a concave/convex structure corresponding to the images of the evaluating marks 36A to 36D respectively, are formed in the respective shot areas SB on the wafer W3 shown in FIG. 6A. Representatively, the resist pattern 36AP is composed of line-and-space patterns 37XP, 37YP each having a concave/convex structure arranged in the X direction and the Y direction respectively as shown in FIG. 6B.

In the subsequent step 125, the line widths and the positions (X coordinates, Y coordinates) of the resist patterns 36AP to 36DP of all of the shot areas SB on the wafer W3 shown in FIG. 6A are measured by using the alignment sensor 23 based on the FIA system under the control of the main control system 22 shown in FIG. 2. Measured values are supplied to the host computer 27. For example, in the case of the resist pattern 36AP shown in FIG. 6B, the widths hX, hY of the ridges (resist portions) of the line-and-space patterns 37XP, 37YP are measured. In this case, the resist coater 54 and the developing apparatus 59 have been adjusted so that the satisfactory characteristics are obtained in this embodiment. Therefore, the line width and the position of the resist pattern 36AP to 36DP depend on the image formation characteristic (for example, the resolution and the aberration) of the projection optical system PL. However, even in the case of the resist coater 54 and the developing apparatus 59, the uneven application and the uneven development remain to some extent. Therefore, the host computer 27 averages the line widths and the positions of the resist patterns 36AP to 36DP in all of the measured shot areas SB to determine the line width and the position of the resist pattern 36AP to 36DP on the image plane of the projection optical system PL. The host computer 27 evaluates the resolution of the projection optical system PL by comparing the line width with the designed value. The host computer 27 evaluates the distortion (including the magnification error) of the projection optical system PL by comparing the positions of the four resist patterns 36AP to 36DP with the designed values.

In the next step 126, the host computer 27 checks whether or not the projection optical system PL is abnormal, i.e., whether or not the resolution and the distortion evaluated in the step 125 are included in allowable ranges with respect to the target values. If there is any abnormality, the host computer 27 issues alarm information on the projection optical system PL to the operator. Corresponding thereto, the adjustment is performed for the projection optical system PL in the step 127. In this case, although not shown, the projection optical system PL shown in FIG. 2 is provided with an image formation characteristic-adjusting mechanism which makes it possible to finely move a plurality of predetermined lenses in the optical axis direction respectively and incline the plurality of predetermined lenses. The image formation characteristic-adjusting mechanism is used to adjust the projection optical system PL. After that, the evaluation sequence corresponding to the steps 120 to 126 may be executed again. Such an image formation characteristic-adjusting mechanism is disclosed in Japanese Patent Application Laid-Open No. 6-45217 and U.S. Pat. No. 6,078,380 corresponding thereto which are incorporated herein by reference. The image formation characteristic-adjusting mechanism of this embodiment can shift the central wavelength of the exposure light beam IL generated from the exposure light source 1 by controlling a wavelength-adjusting section of the exposure light source 1. The image formation characteristic of the projection optical system PL can be also adjusted by means of the wavelength shift.

If the image formation characteristics of the projection optical system PL are not abnormal, the operation proceeds from the step 126 to the step 128 to evaluate the final dynamic characteristic of the projection exposure apparatus 50 in this procedure. For this purpose, the photoresist is applied to an unexposed wafer (referred to as "W4") by using the resist coater 54 shown in FIG. 1 under the control of the host computer 27. After that, the wafer W4 is treated with the pre-bake apparatus 55 and the cooling apparatus 56, and it is loaded on the wafer stage 39 of the projection exposure apparatus 50 (step 129). Subsequently, a test reticle R1 shown in FIG. 7B is loaded onto the reticle stage 31 shown in FIG. 2 (step 130). As shown in FIG. 7B, three pairs of two-dimensional evaluating marks 62A to 62C, 62D to 62F are formed at predetermined intervals in the scanning direction SD (Y direction) in the pattern area of the test reticle RI. Each of the evaluating marks 62A to 62F is formed, for example, with two line-and-space patterns in the same manner as the evaluating mark 36A shown in FIG. 3A.

In the step 131, the respective shot areas SC on the wafer W4 are exposed with the images of the evaluating marks 62A to 62F on the test reticle R1 by the aid of the projection optical system PL in accordance with the step-and-scan manner (scanning exposure manner) by using the projection exposure apparatus 50 shown in FIG. 2. In this procedure, with reference to FIG. 7B, the test reticle R1 is scanned in the scanning direction SD with respect to the illumination area 35. Corresponding thereto, as shown in FIG. 7A, the respective shot areas on the wafer W4 is scanned with respect to the slit-shaped exposure area 35P.

Figure 7A:
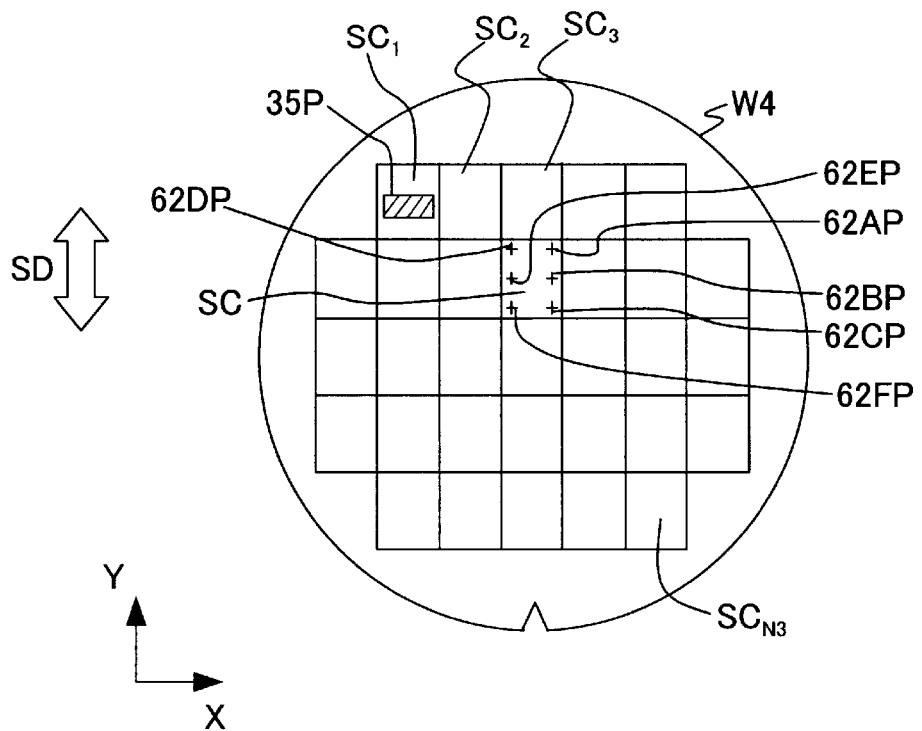
FIG. 7A shows a plan view illustrating a shot array on a wafer for evaluating the dynamic control characteristic of the projection exposure apparatus.
Figure 7B:
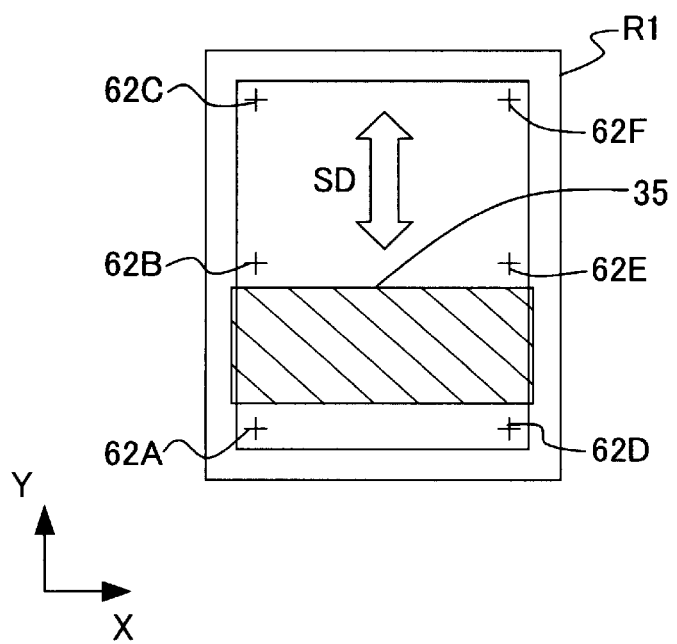
FIG. 7B shows a plan view illustrating a test reticle to be used for this procedure.
Figure 8A:
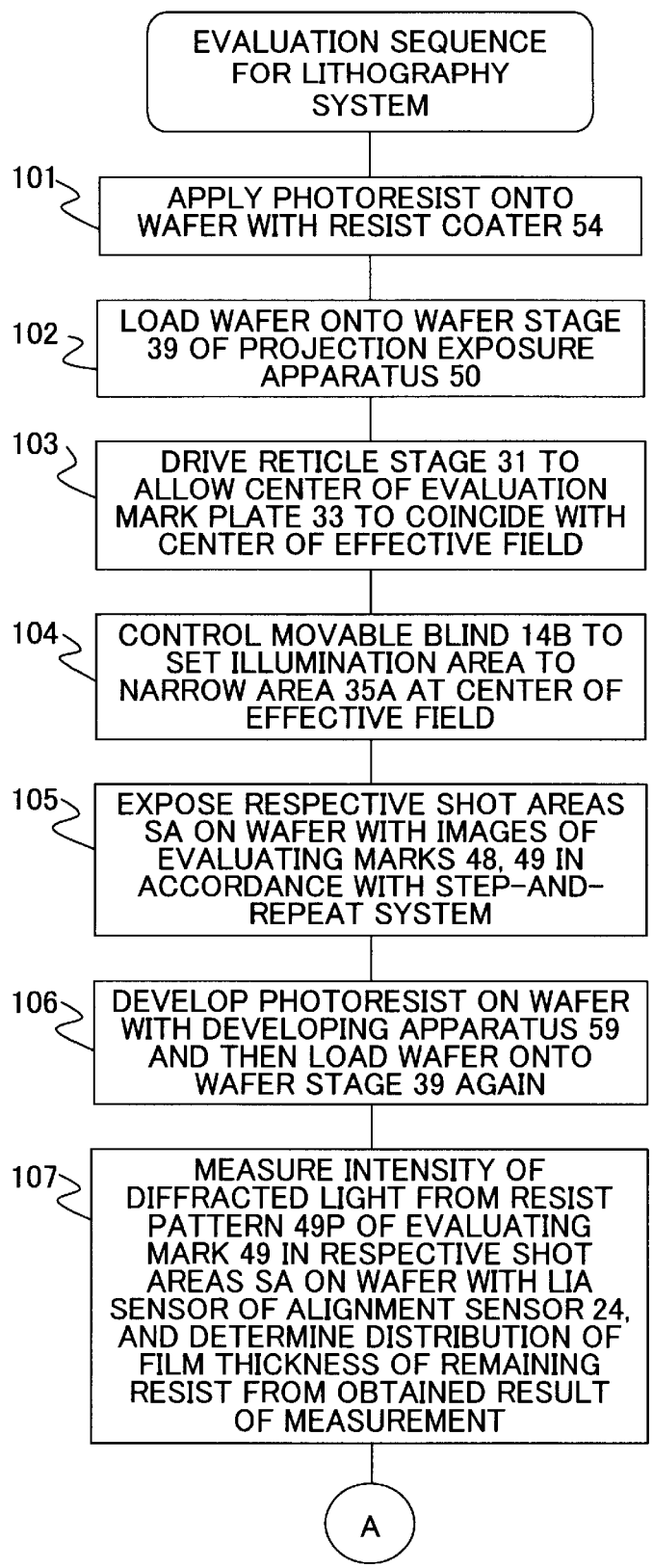
FIGS. 8A and 8B show a flow chart illustrating the former half of an evaluation sequence for the lithography system according to an embodiment of the present invention.
Figure 8B:
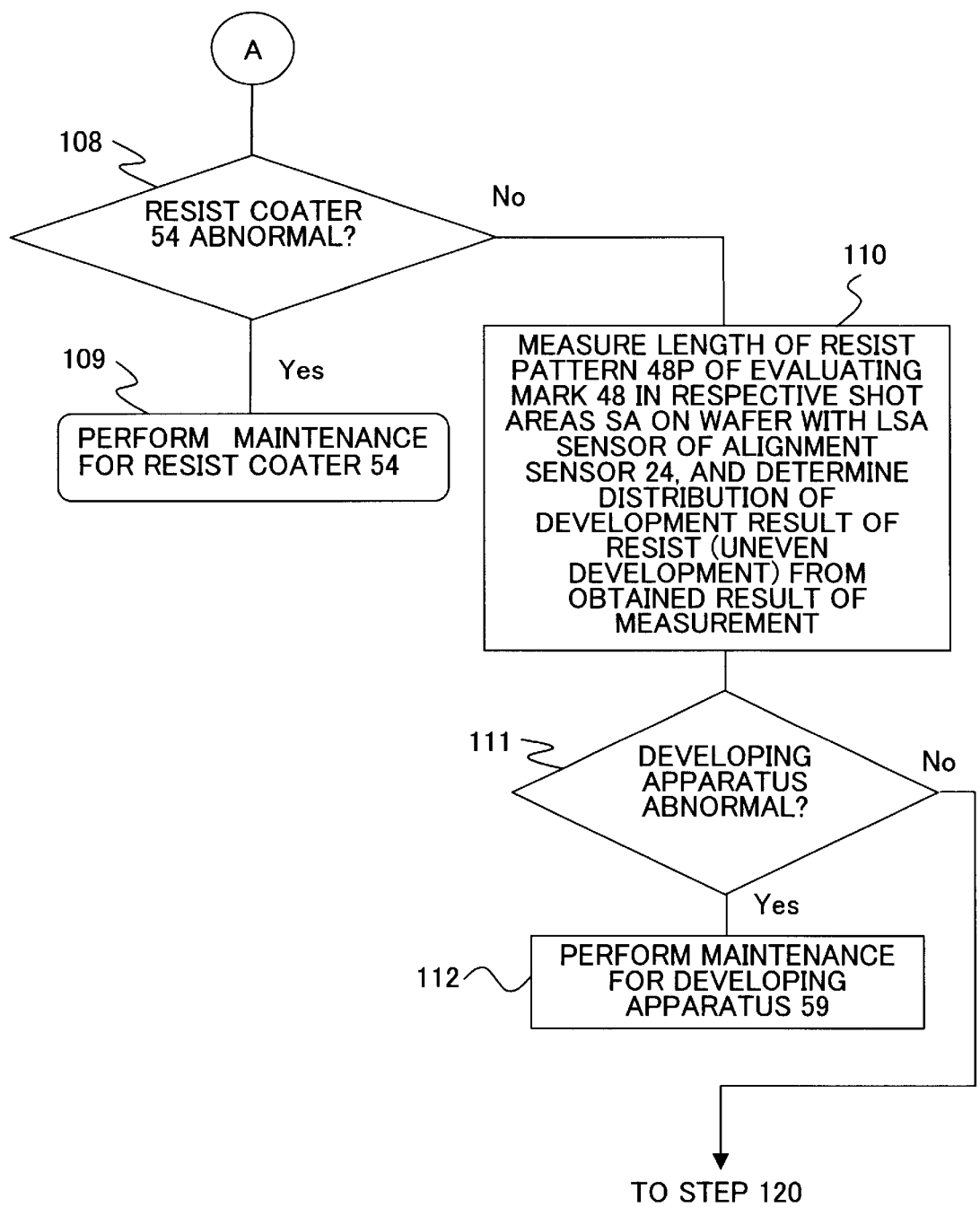

FIG. 7A shows the wafer W4 exposed as described above. With reference to FIG. 7A, the exposure surface of the wafer W4 is divided into N3 (N3<N2) individuals of shot areas $SC_1$, $SC_2$, ... $SC_{N2}$ (they are representatively referred to as "shot areas SC") each having approximately the same size as that of the device to be produced, at predetermined pitches in the X direction and the Y direction. The respective shot areas SC are exposed with the images 62AP to 62FP of the evaluating marks 62A to 62F respectively. In the next step 132, the wafer W4 after the exposure is transported to the developing apparatus 59 via the post-bake apparatus 57 and the cooling apparatus 58 shown in FIG. 1. In the developing apparatus 59, the photoresist on the wafer W4 is developed. The wafer W4 after the development is transported via the transport line 52, and it is loaded onto the wafer stage 39 of the projection exposure apparatus 50 again. In this case, resist patterns (also referred to as 62AP to 62FP), which have a concave/convex structure corresponding to the images of the evaluating marks 62A to 62F respectively, are formed on the respective shot areas SC on the wafer W4 shown in FIG. 7A.

In the subsequent step 133, the line widths and the positions (X coordinates, Y coordinates) of the resist patterns 62AP to 62FP of all of the shot areas SC on the wafer W4 shown in FIG. 7A are measured by using the alignment sensor 23 based on the FIA system under the control of the main control system 22 shown in FIG. 2. Measured values are supplied to the host computer 27. The host computer 27 determines the average value and the dispersion (for example, standard deviation) of the line widths and the positions of the resist patterns 62AP to 62FP in all of the measured shot areas SC to compare the measured values with the designed values. Thus, the host computer 27 evaluates the dynamic control characteristic (for example, synchronization characteristic between the reticle stage and the wafer stage) during the scanning exposure of the projection exposure apparatus 50. The image formation characteristic such as the distortion of the projection optical system PL may be detected as the dynamic control characteristic in the same manner as described above.

In the next step 134, the host computer 27 checks whether or not the dynamic control characteristic is abnormal. If there is any abnormality, the host computer 27 issues alarm information on the dynamic control characteristic to the operator. Corresponding thereto, the adjustment is performed in the step 135 for the stage system including, for example, the reticle stage 31, the wafer stage 39, and the laser interferometers for measuring the positions of them. After that, the evaluation sequence corresponding to the steps 128 to 134 may be executed again. If there is no abnormality in the dynamic control characteristic in the step 134, the operation proceeds to the step 136 to execute the ordinary exposure step for the device pattern.

For example, when the resolution and the image formation characteristic of the projection optical system PL are checked in the step 126 described above, latent images of the evaluating marks 36A to 36D, which are formed on the photoresist on the wafer, may be detected with the alignment sensor 23 to obtain the line width and the position information thereof without performing the development treatment for the photoresist so that the resolution and the image formation characteristic may be determined on the basis of obtained results of the measurement. In this case, the evaluation of the resolution and the image formation characteristic is not affected by the development treatment, because the development treatment is not applied. Therefore, for example, the resolution can be evaluated for a short period of time without determining the uneven development, for example, in the step 110. Also when the dynamic control characteristic is evaluated in the step 133, the latent images may be detected in place of the resist patterns of the evaluating marks 62A to 62F in the same manner as described above. As described above, it is unnecessary to use the characteristic of the uneven development when the evaluation is made for the resolution and the image formation characteristic and when the evaluation is made for the dynamic control characteristic. However, in order to evaluate the developing apparatus 59 which is the part of the coater-developer section 51 (substrate-processing apparatus), it is necessary to obtain the characteristic of the uneven development. Therefore, the uneven development may be separately detected, if necessary.

In the embodiment described above, both of the uneven application of the photoresist and the uneven development are determined. However, when the latent image detection is utilized as described above, only the uneven application may be determined. Alternatively, in the case of a process (layer) in which the influence of the uneven application is considered to be small, only the uneven development may be determined. In the embodiment described above, the image formation characteristic of the projection exposure apparatus 50 is determined. However, no problem arises even when only at least one of the uneven application and the uneven development is determined without determining the image formation characteristic.

As described above, in the evaluation sequence for the lithography system of this embodiment, the movable blind 14B is used as the variable field diaphragm to expose the wafer for evaluation with the images of the evaluating marks 48, 49 in the narrow field. Therefore, the characteristic of the projection exposure apparatus 50 can be distinguished from the characteristic of the resist coater 54 or the developing apparatus 59 to perform the evaluation with ease. Further, the two types of the evaluating marks 48, 49 are used. Therefore, the characteristic of the resist coater 54 can be distinguished from the characteristic of the developing apparatus 59 to perform the evaluation with ease. Accordingly, the lithography system can be adjusted easily and quickly. In the embodiment described above, when the uneven application or the uneven development exceeds the allowable range, namely when any abnormality is observed in the resist coater 54 or the developing apparatus 59, then the maintenance (for example, the change of the application condition or the development condition) is performed for the resist coater 54 or the developing apparatus 59 in the steps 109, 111. However, the uneven application or the uneven development cannot be included within the allowable range in some cases even when the maintenance has been performed. Therefore, for example, the exposure condition (for example, the exposure amount) for the wafer, which is determined by the projection exposure apparatus 50, may be changed so that the change of the line width of the circuit pattern or the like to be formed on the wafer, which would be otherwise caused, for example, by the uneven application or the uneven development, may be compensated. For example, the exposure amount is allowed to partially differ on the wafer depending on the uneven application or the uneven development. Accordingly, even when the uneven application or the uneven development cannot be included within the allowable range, the line width, the shape, and other features of the circuit pattern formed on the wafer can be allowed to substantially coincide with the preset data. Further, when the exposure condition as described above is changed depending on the uneven application or the uneven development, it is even allowable that the steps 109, 112 shown in FIG. 8 are not executed in the embodiment described above. Further, even when the uneven application or the uneven development is included within the allowable range, for example, the change of the exposure condition as described above may be performed, if necessary.

Further, in the embodiment described above, for example, when any abnormality is observed in the resist coater 54, then the photoresist may be applied to the wafer again to transfer the evaluating mark after performing the maintenance for the resist coater 54, and a transferred image may be detected to determine the uneven development. Alternatively, the detection result of the uneven development in the step 110 may be corrected on the basis of the uneven application. Further, when any abnormality is observed in at least one of the resist coater 54 and the developing apparatus 59, the measurement result of the image formation characteristic of the projection exposure apparatus 50 may be corrected on the basis of at least one of the uneven application and the uneven development in the same manner as described above. Alternatively, for example, the evaluating mark may be transferred again after performing the maintenance for at least one of the apparatuses.

In the embodiment described above, when the image of the evaluating mark is projected onto the photoresist in order to detect the characteristic (uneven application or uneven development) of the resist coater 54 or the developing apparatus 59, the narrow field is obtained by using the movable blind 14B. Therefore, the uneven application or the uneven development can be evaluated at a fine spacing distance on the exposure surface on the wafer. However, if it is unnecessary to evaluate the uneven application or the uneven development at an extremely fine spacing distance, a plurality of evaluating marks may be transferred to the respective shot areas by means of one time of exposure operation with a wide field in an opposite manner. In this case, for example, the influence of the image formation characteristic can be avoided, for example, by measuring the images of the evaluating marks at identical positions in the respective shot areas.

In the embodiment described above, in order to evaluate the projection exposure apparatus 50, the resist pattern of the image of the predetermined evaluating mark is measured by using the alignment sensor 23. Other than the above, as disclosed in Japanese Patent No. 2530080, for example, the calibration for the image formation characteristic of the projection exposure apparatus 50 may be performed by forming a predetermined conductor pattern with the projection exposure apparatus 50, and measuring the resistance value of the conductor pattern.

Further, the alignment sensors 23, 24 shown in FIG. 2 and the various evaluating marks are not limited to those referred to in the embodiment described above, which may be arbitrarily constructed. Further, when a transferred image (for example, a resist image or a latent image) of the evaluating mark is detected in order to evaluate the characteristic of at least one of the resist coater 54, the projection exposure apparatus 50, and the developing apparatus 59, for example, a registration measuring apparatus or the like, which is incorporated in the lithography system, may be used.

In FIG. 1, the coater-developer section 51 and the projection exposure apparatus 50 are subjected to the in-line connection. Alternatively, a transport apparatus (for example, AGV) may be provided between the both apparatuses so that the lithography system is constructed in accordance with an off-line arrangement. Further, the type and the number of the apparatuses to be incorporated into the coater-developer section 51 are not limited to those used in the arrangement shown in FIG. 1, for which an arbitrary arrangement may be available. For example, the resist coater 54 and the developing apparatus 59 may be integrated into one apparatus. Alternatively, in place of the coater-developer section 51, a substrate-processing apparatus, which has only a part thereof, for example, only the resist coater 54 or the developing apparatus 59, may be used. The projection exposure apparatus 50 and the coater-developer section 51 are constructed so that the operation of each of them is independently controlled by the unillustrated main controller (for example, a minicomputer) respectively. Therefore, the delivery operation for the wafer may be mutually controlled by sending and receiving, for example, operation situations between the both without providing the host computer 27 shown in FIG. 1. In this embodiment, at least one apparatus other then the projection exposure apparatus 50, of the apparatuses for constructing the lithography system described above (in other words, to be used in the lithography step) is designated as the substrate-processing apparatus.

In the embodiment described above, the projection exposure apparatus based on the scanning exposure manner is used as the exposure apparatus. However, the present invention is also applicable to any procedure to use a projection exposure apparatus (stepper) based on the step-and-repeat manner (full field exposure manner) and an exposure apparatus based on, for example, the proximity system in which no projection system is used. Further, the exposure light beam (exposure beam) is not limited to the ultraviolet light beam described above. For example, the EUV light beam in the soft X-ray region (wavelength: 5 to 50 nm) generated from the SOR (Synchrotron Orbital Radiation) ring or the laser plasma light source may be used. In the case of the EUV exposure apparatus, the illumination optical system and the projection optical system are constructed by only a plurality of reflecting optical elements respectively. Further, for example, a charged particle beam such as a hard X-ray, an electron beam, and an ion beam may be used as the exposure light beam.

A semiconductor device can be produced from the wafer W shown in FIG. 2. The semiconductor device is produced by performing, for example, a step of designing the function and the performance of the device, a step of producing a reticle based on the foregoing step, a step of manufacturing the wafer from a silicon material, a step of exposing the wafer with a pattern on the reticle by using the projection exposure apparatus of the embodiment described above, a step of assembling the device (including a dicing step, a bonding step, and a packaging step), and an inspection step.

The way of use of the lithography system is not limited to those for producing the semiconductor element. The present invention is also widely applicable, for example, to the lithography system for the liquid crystal display element formed on an angular glass plate or for the display device such as the plasma display, and the lithography system for producing various devices including, for example, the image pickup element (for example, CCD), the micromachine, and the thin film magnetic head. Further, the present invention is also applicable to the procedure to be used when the mask (for example, photomask and reticle) formed with the mask pattern of various devices is produced by using the photolithography step. Details of the individual apparatuses and the processes used for the lithography system are disclosed, for example, in U.S. Pat. No. 4,900,939 which is incorporated herein by reference.

It is a matter of course that the present invention is not limited to the embodiment described above, which may be embodied in other various forms without deviating from the gist or essential characteristics of the present invention.

According to the present invention, it is possible to easily and mutually independently evaluate the respective characteristics of the resist-applying step, the exposure step, and resist-developing step to be executed by the lithography system. Further, it is also possible to easily and mutually independently evaluate the respective characteristics of the resist coater, the exposure apparatus, and the developing apparatus for constructing the lithography system.

Further, according to the present invention, for example, the characteristic of the substrate-processing apparatus as a part of the lithography system can be easily evaluated independently from the characteristic of the exposure apparatus, if necessary.

What is claimed is:

1. An evaluating method for a lithography process including an application step of applying a photosensitive material, an exposure step, and a development step in order to form a predetermined development pattern on a substrate applied with the photosensitive material, the evaluating method comprising:

exposing the substrate applied with the photosensitive material with a light beam via an evaluating pattern;

developing the exposed substrate to form a development pattern;

observing the formed development pattern; and determining, from a result of the observation, at least one of an application factor of the application step, an exposure factor of the exposure step and a development factor of the development step, which affect the development pattern respectively, independently from the other factors.

2. The evaluating method according to claim 1, wherein an area for illuminating the evaluating pattern is restricted when the substrate is exposed with the light beam via the evaluating pattern in order to determine the application factor and the development factor independently from the exposure factor respectively.

3. The evaluating method according to claim 2, wherein the evaluating pattern includes patterns for determining the application factor, the development factor and the exposure factor respectively, and a development pattern, which is used to determine the one factor, is observed in order to determine the one factor independently from the other factors.

4. The evaluating method according to claim 1, wherein the application factor, the development factor, and the exposure factor are determined independently respectively.

5. The evaluating method according to claim 1, wherein the development factor is determined after the application factor is determined from the development pattern.

6. The evaluating method according to claim 1, wherein the application factor is uneven application, and the development factor is uneven development.

7. The evaluating method according to claim 1, wherein when a substrate-processing condition in at least one of the application step and the development step is changed, at least one of the application factor and the development factor of the step in which the substrate-processing condition thereof is changed is determined independently from the exposure factor.

8. The evaluating method according to claim 1, wherein:
at least one of the application factor and the development factor is determined independently from the exposure factor; and
a substrate-processing condition is adjusted, on the basis of the determined factor, in the at least one of the application step and the development step of which factor is determined.

9. The evajuating method according to claim 1, wherein:
at least one of the application factor and the development factor is determined independently from the exposure factor; and
a substrate-processing condition in the exposure step is adjusted on the basis of the determined factor.

10. A method for producing a device including a lithography process, comprising:
determining, by using the evaluating method as defined in claim 1, at least one of the application factor, the exposure factor and the development factor independently from the other factors; and
adjusting a substrate-processing condition in the lithography process on the basis of the at least one factor,
wherein a substrate on which a pattern is formed by the lithography process in which the substrate-processing condition has been adjusted is obtained.

11. The method for producing the device according to claim 10, wherein a substrate-processing condition is adjusted in at least one of the application step, the exposure step and the development step of which factor is determined.

12. A method for evaluating a lithography system including an applying apparatus which applies a photosensitive material to a substrate, an exposure apparatus which exposes the substrate applied with the photosensitive material, and a developing apparatus which develops the photosensitive material, the method comprising:
a first step of applying the photosensitive material onto the substrate by using the applying apparatus;
a second step of exposing the substrate applied with the photosensitive material with a light beam via an evaluating pattern by the aid of the exposure apparatus;
a third step of developing the photosensitive material on the substrate by using the developing apparatus;
a fourth step of measuring a development pattern of the photosensitive material on the substrate having been subjected to the development; and
a fifth step of evaluating at least one of a characteristic of the applying apparatus, a characteristic of the exposure apparatus, and a characteristic of the development apparatus which affect the development pattern respectively, independently from the other characteristics, on the basis of a result of the measurement in the fourth step.

13. The method for evaluating the lithography system according to claim 12, wherein:
the exposure apparatus comprises a projection system which projects an image of a mask pattern onto the substrate;
an image of the evaluating pattern is projected onto a plurality of comparted areas on the substrate through a predetermined narrow area in an effective field of the projection system in the second step; and
the characteristic of the applying apparatus or the characteristic of the developing apparatus is evaluated in the fifth step.

14. The method for evaluating the lithography system according to claim 13, wherein:
a physical quantity, which corresponds to a dispersion of a thickness of the development pattern of the photosensitive material formed in the plurality of comparted areas on the substrate, is measured in the fourth step; and
uneven application of the photosensitive material, which is caused by the applying apparatus, is evaluated in the fifth step.

15. The method for evaluating the lithography system according to claim 14, wherein:
the evaluating pattern includes a plurality of wedge-shaped patterns arranged in a direction intersecting a measuring direction;
a dispersion of a length in the measuring direction of the development pattern of the photosensitive material formed in the plurality of comparted areas on the substrate is measured in the fourth step; and
uneven development of the developing apparatus is evaluated in the fifth step.

16. The method for evaluating the lithography system according to claim 12, wherein:
the exposure apparatus comprises a projection system which projects an image of a mask pattern onto the substrate;
an image of the evaluating pattern is projected onto a plurality of comparted areas on the substrate through a predetermined wide area in an effective field of the projection system in the second step; and
the characteristic of the projection system of the exposure apparatus is evaluated in the fifth step.

17. The method for evaluating the lithography system according to claim 13, wherein:
the exposure apparatus is a scanning exposure type exposure apparatus which exposes the substrate by synchronously moving a mask and the substrate;
the image of the evaluating pattern is projected onto the plurality of comparted areas on the substrate in accordance with a scanning exposure manner in the second step; and
a dynamic characteristic of the exposure apparatus is evaluated in the fifth step.

18. The method for evaluating the lithography system according to claim 14, wherein the physical quantity is measured by using a first sensor provided for the exposure apparatus.

19. The method for evaluating the lithography system according to claim 15, wherein the dispersion of the length in the measuring direction of the development pattern is measured by using a second sensor provided for the exposure apparatus.

20. The method for evaluating the lithography system according to claim 14, further comprising:
   a sixth step of measuring the dispersion of the length in the measuring direction of the development pattern of the photosensitive material formed in the plurality of comparted areas on the substrate; and
   a seventh step of evaluating uneven development of the developing apparatus.

21. The method for evaluating the lithography system according to claim 20, further comprising:
   an eighth step of applying the photosensitive material onto another substrate by using the applying apparatus;
   a ninth step of exposing the photosensitive material on the substrate applied with the photosensitive material by projecting an image of a pattern different from the evaluating pattern onto the plurality of comparted areas on the substrate through a predetermined wide area in the effective field of the projection system;
   a tenth step of developing the photosensitive material exposed in the ninth step; and
   an eleventh step of evaluating any characteristic of the projection system of the exposure apparatus by measuring a development pattern of the photosensitive material developed in the tenth step.

22. The method for evaluating the lithography system according to claim 21, further comprising adjusting the projection system in accordance with the evaluated characteristic of the projection system.

23. The method for evaluating the lithography system according to claim 22, wherein:
   the exposure apparatus is a scanning exposure type exposure apparatus for exposing the substrate by synchronously moving a mask and the substrate, and the method further comprises:
   a twelfth step of applying the photosensitive material to a test substrate by using the applying apparatus;
   a thirteenth step of projecting an image of an evaluating mask onto the plurality of comparted areas on the substrate in accordance with a scanning exposure manner to expose the photosensitive material;
   a fourteenth step of developing the photosensitive material exposed in the thirteenth step; and
   a fifteenth step of observing and evaluating a dynamic characteristic of the exposure apparatus.

24. The method for evaluating the lithography system according to claim 12, wherein when a substrate-processing condition in at least one of the applying apparatus and the developing apparatus is changed, a characteristic of the apparatus in which the substrate-processing condition thereof is changed is evaluated independently from the characteristic of the exposure apparatus.

25. The method for evaluating the lithography system according to Claim 12, wherein a substrate-processing condition in the lithography system is adjusted on the basis of the at least one characteristic.

26. A method for producing a device using a lithography system, comprising:
   evaluating, by using the method for evaluating the lithography system as defined in claim 12, at least one of the characteristic of the applying apparatus, the characteristic of the exposure apparatus, and the characteristic of the developing apparatus independently from the other characteristics; and
   adjusting a substrate-processing condition in the lithography system on the basis of the at least one characteristic,
   wherein a substrate on which a pattern is formed by the lithography system in which the substrate-processing condition has been adjusted is obtained.

27. An evaluating method for a lithography system including an exposure apparatus which exposes a substrate applied with a photosensitive material, and a substrate-processing apparatus which processes the substrate during at least one process to be performed before or after the exposure of the photosensitive material, the evaluating method comprising:
   transferring an evaluating pattern onto the photosensitive material by using the lithography system to form a transferred image;
   measuring a state of the transferred image; and
   independently evaluating a characteristic of the exposure apparatus and a characteristic of the substrate-processing apparatus on the basis of a result of the measurement.

28. The evaluating method according to claim 27, wherein a size of an area of illumination of the evaluating pattern is adjusted depending on the characteristic to be determined when the substrate is exposed with the evaluating pattern in order to independently determine the characteristic of the exposure apparatus and the characteristic of the substrate-processing apparatus.

29. The evaluating method according to claim 28, wherein the evaluating pattern includes patterns which determine the characteristic of the exposure apparatus and the characteristic of the substrate-processing apparatus respectively, and the developed patterns are observed.

30. The evaluating method according to claim 27, wherein the transferred image is a latent image formed by exposing the photosensitive material with a light beam.

31. The evaluating method according to claim 27, wherein the substrate-processing apparatus includes an applying apparatus which applies the photosensitive material onto the substrate, and a developing apparatus which develops the photosensitive material.

32. The evaluating method according to claim 27, wherein the characteristic of the exposure apparatus is an image formation characteristic of a projection system provided for the exposure apparatus, and the characteristic of the substrate-processing apparatus is uneven application of the photosensitive material.

33. The evaluating method according to claim 27, wherein the characteristic of the substrate-processing apparatus is detected on the basis of the result of the measurement, and the substrate-processing apparatus is adjusted depending on the detected characteristic; and
   the transferred image is again formed by transferring the evaluating pattern onto the photosensitive material with the lithography system in which the substrate-processing apparatus has been adjusted, and the characteristic of the exposure apparatus is detected on the basis of a measurement result for a state of the transferred image.

34. The evaluating method according to claim 27, wherein the characteristic of the substrate-processing apparatus is detected on the basis of the result of the measurement, and the characteristic of the exposure apparatus is detected on the basis of the result of the measurement and the detected characteristic of the substrate-processing apparatus.

35. The evaluating method according to claim 34, wherein the exposure apparatus transfers a device pattern onto a second object in a scanning exposure manner in which a first object which has the device pattern and the second object which is photosensitive are synchronously moved when a device is manufactured, and the exposure apparatus transfers the evaluating pattern onto the substrate in a static exposure manner when the transferred image is formed.

36. The evaluating method according to claim 35, wherein the exposure apparatus is adjusted depending on the detected characteristic of the exposure apparatus.

37. The evaluating method according to claim 36, wherein the transferred image is formed by transferring the evaluating pattern onto the substrate in the scanning exposure manner in addition to forming the transferred image in the static exposure manner, and a dynamic characteristic of the exposure apparatus is detected on the basis of a measurement result of a state of the transferred image.

38. The evaluating method according to claim 37, wherein the exposure apparatus comprises a projection system which forms a projection image of each of the device pattern and the evaluating pattern, and the characteristic of the exposure apparatus includes at least an optical characteristic of the projection system.

39. The evaluating method according to claim 27, wherein when a substrate-processing condition in the substrate-processing apparatus is changed, the characteristic of the substrate-processing apparatus is evaluated independently from the characteristic of the exposure apparatus.

40. The evaluating method according to claim 27, wherein on the basis of the characteristic of the substrate-processing apparatus, one of a substrate-processing condition in the substrate-processing apparatus and a substrate-processing condition in the exposure apparatus is adjusted.

41. The evaluating method according to claim 27, wherein:
the transferred image is a development pattern obtained by developing the photosensitive material; and
the characteristic of the substrate-processing apparatus includes at least one of a characteristic of an applying apparatus which applies the photosensitive material to the substrate and a characteristic of a developing apparatus which develops the photosensitive material.

42. The evaluating method according to claim 27, wherein the transferred image is a latent image obtained by exposing the photosensitive material, and the characteristic of the substrate-processing apparatus includes a characteristic of an applying apparatus which applies the photosensitive material to the substrate.

43. A method for producing a device using a lithography system, comprising:
evaluating, by using the evaluating method as defined in claim 27, the characteristic of the exposure apparatus and the characteristic of the substrate-processing apparatus; and
adjusting a substrate-processing condition in the lithography system on the basis of at least one of the evaluated characteristics,
wherein a substrate on which a pattern is formed by the lithography system in which the substrate-processing condition thereof has been adjusted is obtained.

44. An adjusting method for a substrate-processing apparatus which constitutes a lithography system together with an exposure apparatus which exposes a substrate applied with a photosensitive material and which treats the substrate during at least one process to be performed before or after the exposure of the photosensitive material, the adjusting method comprising:

transferring an evaluating pattern onto the photosensitive material on the substrate by using the lithography system to form a transferred image;
measuring a state of the transferred image; and
detecting a characteristic of the substrate-processing apparatus independently from a characteristic of the exposure apparatus on the basis of a result of the measurement.

45. The adjusting method according to claim 44, further comprising adjusting the substrate-processing apparatus when the detected characteristic does not satisfy a predetermined value.

46. The adjusting method according to claim 44, wherein the transferred image is a latent image formed by exposing the photosensitive material with a light beam.

47. The adjusting method according to claim 44, wherein the substrate-processing apparatus includes an applying apparatus which applies the photosensitive material onto the substrate, and a developing apparatus which develops the photosensitive material.

48. The adjusting method according to claim 44, wherein the characteristic of the exposure apparatus is an image formation characteristic of a projection system provided for the exposure apparatus, and the characteristic of the substrate-processing apparatus is uneven application of the photosensitive material.

49. The adjusting method according to claim 44, wherein the evaluating pattern includes a pattern which determines the characteristic of the substrate-processing apparatus independently from the characteristic of the exposure apparatus.

50. The adjusting method according to claim 44, wherein when a substrate-processing condition in the substrate-processing apparatus is changed, the characteristic of substrate-processing apparatus is detected independently from the characteristic of the exposure apparatus.

51. The adjusting method according to claim 44, wherein on the basis of the detected characteristic, one of a substrate-processing condition in the substrate-processing apparatus and a substrate-processing condition in the exposure apparatus is adjusted.

52. The adjusting method according to claim 44, wherein:
the transferred image is a development pattern obtained by developing the photosensitive material; and
the characteristic of the substrate-processing apparatus includes at least one of a characteristic of an applying apparatus which applies the photosensitive material to the substrate and a characteristic of a developing apparatus which develops the photosensitive material.

53. The adjusting method according to claim 52, wherein:
the characteristic of the developing apparatus is evaluated on the basis of a result of the measurement of the development pattern; and
the characteristic of the applying apparatus is evaluated in a process different from the process in which the characteristic of the developing apparatus is evaluated.

54. The adjusting method according to claim 44, wherein the transferred image is a latent image obtained by exposing the photosensitive material, and the characteristic of the substrate-processing apparatus includes a characteristic of an applying apparatus which applies the photosensitive material to the substrate.

55. A method for producing a device using a lithography system, comprising:
detecting by using the adjusting method as defined in claim 44, the characteristic of the substrate-processing apparatus independently from the characteristic of the exposure apparatus; and adjusting a substrate-processing condition in the lithography system on the basis of the detected characteristic, wherein a substrate on which a pattern is formed by the lithography system in which the substrate-processing condition has been adjusted is obtained.

56. A method for producing a device with a lithography system including an applying apparatus, an exposure apparatus and a developing apparatus, comprising:

a first step of applying a photosensitive material onto a substrate by using the applying apparatus;

a second step of exposing the substrate applied with the photosensitive material with a light beam via an evaluating pattern by using the exposure apparatus;

a third step of developing the photosensitive material on the substrate by using the developing apparatus;

a fourth step of measuring a development pattern of the developed photosensitive material on the substrate;

a fifth step of evaluating one of a characteristic of the applying apparatus, a characteristic of the exposure apparatus, and a characteristic of the developing apparatus which affect the development pattern respectively, independently from the other characteristics, on the basis of a result of the measurement performed in the fourth step;

a sixth step of adjusting the apparatus having the evaluated characteristic in accordance with the evaluated characteristic; and a seventh step of executing the first to third steps by using a pattern for forming the device in place of the evaluating pattern after the adjustment performed in the sixth step to obtain the substrate on which a development pattern for forming the device is formed.

57. A measuring method for measuring an application state of a photosensitive material on a substrate to be exposed by using an exposure apparatus provided with an illumination system which illuminates the substrate applied with the photosensitive material, the measuring method comprising:

exposing the substrate applied with the photosensitive material with a light beam via an evaluating mark; and detecting a state of an exposed pattern of the evaluating mark subjected to the exposure to determine the application state of the photosensitive material so that affect of at least an exposure factor that affects the exposed pattern is excluded.

58. The measuring method according to claim 57, wherein the evaluating mark is formed on the substrate.

59. The measuring method according to claim 57, further comprising developing the substrate after exposing the substrate with the light beam via the evaluating mark, wherein the application state of the photosensitive material is determined by detecting a state of the exposed pattern of the developed evaluating mark.

60. The measuring method according to claim 57, wherein the state of the exposed pattern is detected by using detector of the exposure apparatus which is used to execute alignment for an exposure position of the substrate when the substrate is exposed.

61. The measuring method according to claim 57, wherein a light beam from a light source possessed by the exposure apparatus is used when the substrate is exposed with the light beam via the evaluating mark.

62. An exposure method comprising a step of adjusting an exposure condition for a photosensitive second object with a light beam via a first object having a device pattern in an exposure apparatus on the basis of a development state measured by using the measuring method as defined in claim 57.

63. The measuring method according to claim 57, wherein a substrate-processing condition in a lithography system is adjusted on the basis of the determined application state, the lithography system including the exposure apparatus and an applying apparatus which applies the photosensitive material to the substrate.

64. The measuring method according to claim 63, wherein the substrate- processing condition which is adjusted is different from an application condition of the applying apparatus.

65. A method for producing a device using a lithography system, comprising:

determining, by using the measuring method as defined in claim 44, the application state of the photosensitive material; and adjusting a substrate-processing condition in the lithography system on the basis of the determined application state, the lithography system including the exposure apparatus and an applying apparatus which applies the photosensitive material to the substrate, wherein a substrate on which a pattern is formed by the lithography system in which the substrate-processing condition has been adjusted is obtained.

66. A measuring method for measuring a development state of a photosensitive material on a substrate to be exposed by using an exposure apparatus provided with an illumination system which illuminates the substrate applied with the photosensitive material, the measuring method comprising:

exposing the substrate applied with the photosensitive material with a light beam via an evaluating mark;

developing the exposed substrate; and detecting a development pattern of the evaluating mark subjected to the development to determine the development state of the photosensitive material so that affect of at least an exposure factor that affects the development pattern is excluded.

67. The measuring method according to claim 66, wherein a state of the development pattern is detected by using a detector of the exposure apparatus which is used to execute alignment for an exposure position of the substrate when the substrate is exposed.

68. The measuring method according to claim 57, wherein a light beam from a light source provided on the exposure apparatus is used when the substrate is exposed with the light beam via the evaluating mark.

69. An exposure method comprising a step of adjusting an exposure condition for a photosensitive second object with a light beam via a first object having a device pattern in an exposure apparatus on the basis of an application state measured by using the measuring method as defined in claim 66.

70. The measuring method according to claim 66, wherein a substrate-processing condition in a lithography system is adjusted on the basis of the determined development state, the lithography system including the exposure apparatus and a developing apparatus which develops the photosensitive material.

71. The measuring method according to claim 70, wherein the substrate-processing condition which is adjusted is different from a development condition of the developing apparatus.

72. A method for producing a device using a lithography system, comprising:

determining, by using the measuring method as defined in claim 66, the development state of the photosensitive material; and adjusting a substrate-processing condition in the lithography system on the basis of the determined development state; the lithography system including the exposure apparatus and a developing apparatus which develops the photosensitive material, wherein a substrate on which a pattern is formed by the lithography system in which the substrate-processing condition has been adjusted is obtained.

* * * * *

UNITED STATES PATENT AND TRADEMARK OFFICE
CERTIFICATE OF CORRECTION

PATENT NO.   : 6,737,207 B2
DATED        : May 18, 2004
INVENTOR(S)  : Yuji Imai It is certified that error appears in the above-identified patent and that said Letters Patent is hereby corrected as shown below:

<u>Column 34,</u>
Line 21, change "claim 44" to -- claim 57 --.

Signed and Sealed this

Twenty-fourth Day of August, 2004

JON W. DUDAS
*Director of the United States Patent and Trademark Office*